US010373699B2

(12) United States Patent
Zhu et al.

(10) Patent No.: US 10,373,699 B2
(45) Date of Patent: Aug. 6, 2019

(54) ARRAY SUBSTRATE, DISPLAY PANEL AND DISPLAY DEVICE

(71) Applicant: WUHAN TIANMA MICRO-ELECTRONICS CO., LTD., Wuhan (CN)

(72) Inventors: Zaiwen Zhu, Shanghai (CN); Yong Yuan, Shanghai (CN); Feng Lu, Shanghai (CN); Qijun Yao, Shanghai (CN); Qitai Ji, Shanghai (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 15/865,268

(22) Filed: Jan. 9, 2018

(65) Prior Publication Data
US 2018/0130543 A1 May 10, 2018

(30) Foreign Application Priority Data
Aug. 22, 2017 (CN) .......................... 2017 1 0723467

(51) Int. Cl.
| | |
|---|---|
| *G11C 27/04* | (2006.01) |
| *G06F 3/041* | (2006.01) |
| *G06F 3/045* | (2006.01) |
| *H01L 27/12* | (2006.01) |
| *H01L 49/02* | (2006.01) |
| *G11C 19/28* | (2006.01) |
| *G11C 19/18* | (2006.01) |

(52) U.S. Cl.
CPC .............. *G11C 27/04* (2013.01); *G06F 3/045* (2013.01); *G06F 3/0416* (2013.01); *G11C 19/28* (2013.01); *H01L 27/124* (2013.01); *H01L 27/1255* (2013.01); *H01L 28/20* (2013.01); *G06F 2203/04105* (2013.01); *G06F 2203/04111* (2013.01); *G11C 19/182* (2013.01)

(58) Field of Classification Search
CPC ......... G06F 3/0414; G06F 2203/04105; G06F 3/0412; G06F 2203/04103; G06F 3/044; G09G 2310/0286; G09G 2310/0267; G09G 2310/0281
See application file for complete search history.

(56) References Cited

U.S. PATENT DOCUMENTS

| | | | | |
|---|---|---|---|---|
| 2013/0057485 | A1* | 3/2013 | Lim | .................... H04M 1/0266 345/173 |
| 2014/0253305 | A1* | 9/2014 | Rosenberg | .............. G06F 3/016 340/407.2 |

(Continued)

*Primary Examiner* — Koosha Sharifi-Tafreshi
(74) *Attorney, Agent, or Firm* — Kilpatrick Townsend & Stockton LLP

(57) ABSTRACT

Provided are an array substrate, a display panel and a display device, and the array substrate includes: at least one pressure sensor disposed in the non-display region; and the pressure sensor includes a first resistor, a second resistor, a third resistor and a fourth resistor; and a plurality of shift registers disposed in the non-display region, and the first resistor, the second resistor, the third resistor and the fourth resistor are disposed at least one of following positions: inside the shift register, between adjacent two of the plurality of shift registers, at a side of the plurality of shift registers close to the display region, and at a side of the plurality of shift registers away from the display region.

17 Claims, 15 Drawing Sheets

(56) References Cited

U.S. PATENT DOCUMENTS

2015/0169100 A1* 6/2015 Tsuyuki ............... G06F 1/1656
                                              345/173
2017/0269756 A1* 9/2017 Wang ................... G06F 3/0414
2017/0277296 A1* 9/2017 Reynolds ............... G06F 3/044

* cited by examiner

ARRAY SUBSTRATE, DISPLAY PANEL AND DISPLAY DEVICE

CROSS-REFERENCE TO RELATED APPLICATIONS

This application claims priority to Chinese patent application No. 201710723467.2 filed on Aug. 22, 2017, the disclosure of which is incorporated herein by reference in its entirety.

TECHNICAL FIELD

The present disclosure relates to touch technologies, and in particular to an array substrate, a display panel and a display device.

BACKGROUND

At present, a display panel is widely applied in various electronic devices, e.g. mobile phones, tablet computers and kiosks in the public place. As such, the user may perform the operations on the electronic devices by merely touching the icons in the electronic devices using his finger, so that the user does not need other input devices (e.g. keyboards and mice), thereby making human-machine interaction easier.

In order to better meet the requirements for the users, a pressure sensor is commonly integrated into the display panel to detect the magnitude of the touch pressure when the users touching the display panel, thereby improving the applied range of touch technologies. However, at present, the display panel includes a display region and a non-display region surrounding the display region. And the pressure sensor is commonly disposed between two adjacent shift registers of the non-display region of the display panel. Due to the excessively large size of the pressure sensor, the position of the shift registers needs to be adjusted, and the distance between the edge of the shift register close to the display region and the boundary between the display region and non-display region needs to be widen, which enables the signal outputting terminal of each shift register to be electrically connected to the corresponding scanning lines of the display region. Undoubtedly, the increased distance between the edge of the shift register close to the display region and the boundary between the display region and non-display region would increase the area of the non-display region of the display panel, which is not favorable to the developing trends of narrow-frame design.

SUMMARY

The present disclosure provides an array substrate, a display panel and a display device, which enables the area of the non-display region of the display panel to be decreased and hence is favorable to the developing trends of narrow-frame design.

In a first aspect, the present disclosure provides an array substrate, and the array substrate includes: a base substrate, and the base substrate includes a display region and a non-display region surrounding the display region, and the base substrate further includes a first side extending in a first direction and a second side extending in a second direction, and the first direction and the second direction are intersected with each other; at least one pressure sensor is disposed in the non-display region of the base substrate; and the at least one pressure sensor includes a first resistor, a second resistor, a third resistor and a fourth resistor, and a bridge structure is formed by the first resistor, the second resistor, the third resistor and the fourth resistor; and the non-display region of the based substrate further includes a plurality of shift registers successively arranged along the second direction, a length of each of the plurality of shift registers in the first direction is greater than a length of each of the plurality of shift registers in the second direction, and the first resistor, the second resistor, the third resistor and the fourth resistor are disposed at least one of following positions: inside the shift register, between adjacent two of the plurality of shift registers, at a side of the plurality of shift registers close to the display region, and at a side of the plurality of shift registers away from the display region.

In a second aspect, the present disclosure further provides a display panel, and the display panel includes an array substrate according to the first aspect.

In a third aspect, the present disclosure further provides a display device, including a display panel according to the second aspect.

In the present disclosure, the first resistor, the second resistor, the third resistor and the fourth resistor are disposed at least one of following positions: inside the shift register, between adjacent two of the plurality of shift registers, at a side of the plurality of shift registers close to the display region and at a side of the plurality of shift registers away from the display region; when one of the first resistor, the second resistor, the third resistor and the fourth resistor is disposed between adjacent two of the shift registers, an extension length of the resistor along the first direction is greater than that along the second direction; when one of the first resistor, the second resistor, the third resistor and the fourth resistor is disposed at a side of the display region close to the plurality of shift registers, an extension length of the resistor along the second direction is greater than that along the first direction, so that it solves the problem that the area of the non-display region of the display panel is increased due to the adjustment of the positions of the shift registers and the widened distance between the edge of the shift register close to the display region and the boundary between the display region and the non-display region because of the excessively large size of the pressure sensor of the conventional display panel, thereby decreasing the area of the non-display region of the display panel and conforming to the developing trends of narrow-frame design.

DETAILED DESCRIPTION

Figure 1:
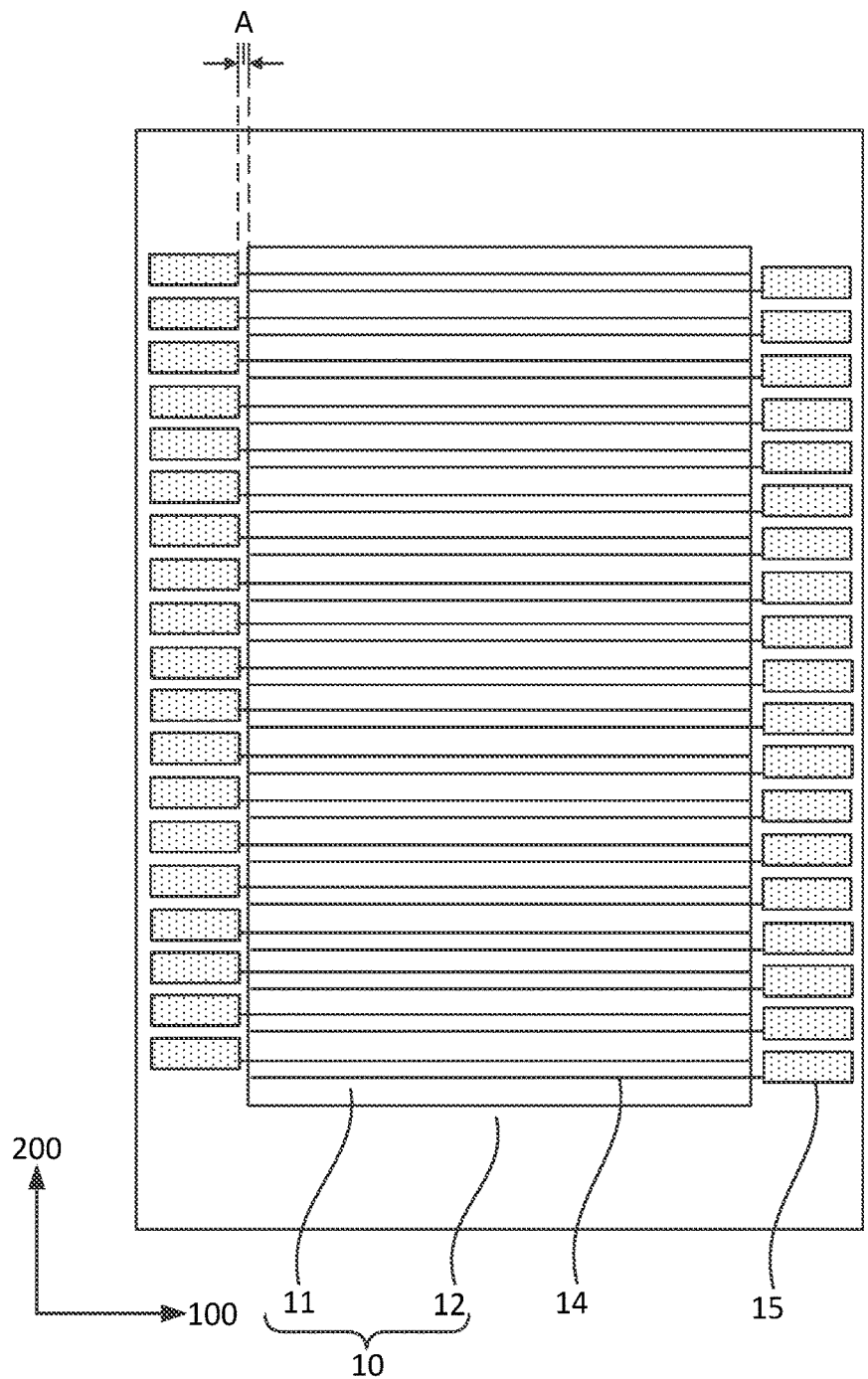
FIG. 1 is a structural diagram showing an array substrate in the related art.

The present disclosure is further described below in combination with the drawings and embodiments. It should be understood that, the embodiments described herein are merely used to explain the present disclosure rather than limiting the present disclosure. In addition, it should be stated that in order to facilitate the description, merely a part of structures related to the present disclosure rather than the whole structure are illustrated in the drawings.

FIG. 1 is a structural diagram showing an array substrate in the related art. There is no pressure sensor disposed in the array substrate. Referring to FIG. 1, the array substrate includes a base substrate 10. The base substrate 10 includes a display region 11 and a non-display region 12 which surrounds the display region 11, and the base substrate 10 further includes a first side extending in a first direction 100 and a second side extending in a second direction 200, and the first direction 100 and the second direction 200 are intersected with each other.

Still referring to FIG. 1, the display region 11 of the base substrate 10 includes a plurality of scanning lines 14 extending along the first direction 100 and a plurality of data lines extending along the second direction 200 (not shown in FIG. 1). A plurality of pixel units are formed by the crossing regions between the scanning lines 14 and the data lines (not shown in FIG. 1). The non-display region 12 of the base substrate 10 further includes a plurality of shift registers 15 successively disposed along the second direction 200, and the length of the shift register 15 in the first direction 100 is greater than that of the shift register 15 in the second direction 200. The shift register 15 includes a signal outputting terminal which is electrically connected to at least one of the scanning lines 14, in order to provide a scanning signal to the corresponding scanning line 14, thereby controlling the working state of the pixel unit electrically connected with the scanning line 14 to perform image display.

Figure 2:
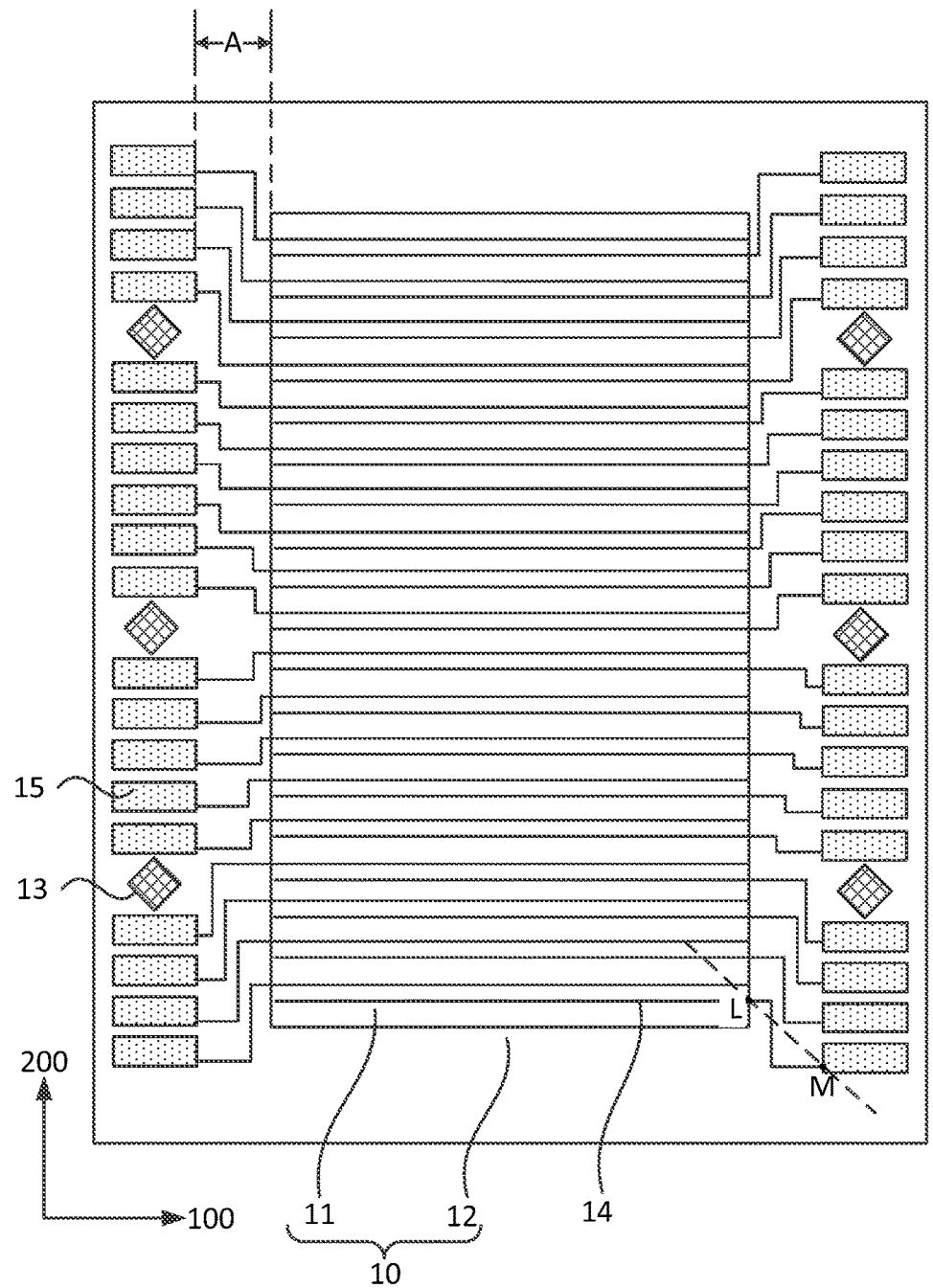
FIG. 2 is a structural diagram showing another array substrate in the related art.

FIG. 2 is a structural diagram showing another array substrate in the related art. There is a pressure sensor disposed in the array substrate. Referring to FIG. 2, the pressure sensor 13 is disposed between adjacent two of the shift registers 15 in the non-display region 12 of the base substrate 10.

Comparing FIG. 1 with FIG. 2, since the size of pressure sensor 13 is excessively large, the position of the shift register 15 needs to be adjusted so as to release a large region to dispose the pressure sensor 13. After adjusting the position of the shift register 15, the signal outputting terminal of the shift register is misaligned with the corresponding scanning line 14 in the row direction. The term "misalign" refers to that an intersection point L of the boundary between the display region 11 and the non-display region 12 with the scanning line 14 is connected with the signal outputting terminal M of corresponding shift register 15 to form a line LM, and such the line LM is not parallel to the extending direction of the scanning line 14. Thus the part of the scanning line 14 extended to the non-display region 12 needs to be bended, to connect the scanning line 14 with the outputting terminal M of the shift register. Undoubtedly, when the signal outputting terminals of many of the shift registers 15 and the corresponding scanning lines 14 are misaligned in the row direction, the distance A between the edge of the shift register 15 close to the display region 11 and the boundary between the display region 11 and non-display region 12 would be increased, thereby increasing the area of the non-display region 12 of the display panel, which is not favorable to the developing trends of narrow-frame design.

Embodiments of the present disclosure provide an array substrate, and the array substrate including: a base substrate, and the base substrate includes a display region and a non-display region surrounding the display region, and the base substrate further includes a first direction and a second direction both parallel to the base substrate, and the first direction and the second direction are intersected with each other; at least a pressure sensor is disposed in the non-display region of the base substrate; and the pressure sensor includes a first resistor, a second resistor, a third resistor and a fourth resistor, and a bridge structure is formed by the first resistor, the second resistor, the third resistor and the fourth resistor; and the non-display region of the based substrate further includes a plurality of shift registers successively arranged along the second direction, the length of the shift register in the first direction is greater than that of the shift register in the second direction, and the first resistor, the second resistor, the third resistor and the fourth resistor are disposed at least one of: inside the shift register, between adjacent two of the shift registers, at a side of the shift register close to the display region, and at a side of the shift register away from the display region; and the extension length of the resistor disposed between adjacent two of the shift registers along the first direction is greater than that along the second direction, the extension length of the resistor disposed at a side of the display region close to the shift register along the second direction is greater than that along the first direction.

In above technical solutions, the first resistor, the second resistor, the third resistor and the fourth resistor are disposed at least one of following positions: inside the shift register, between adjacent two of the plurality of shift registers, at a side of the plurality of shift registers close to the display region, and at a side of the plurality of shift registers away from the display region. In one embodiment, the first resistor may be located inside the shift register, between the adjacent two of the shift registers, at a side of the shift register close to the display region or at a side of the shift register away from the display region; the second resistor may be located inside the shift register, between the adjacent two of the shift registers, at a side of the shift register close to the display region or at a side of the shift register away from the display region; the third resistor may be located inside the shift register, between the adjacent two of the shift registers, at a side of the shift register close to the display region or at a side of the shift register away from the display region; and the fourth resistor may be located inside the shift register, between the adjacent two of the shift registers, at a side of the shift register close to the display region or at a side of the shift register away from the display region. Also, the positions of the first resistor, the second resistor, the third resistor and the fourth resistor do not affect each other.

Figure 3A:
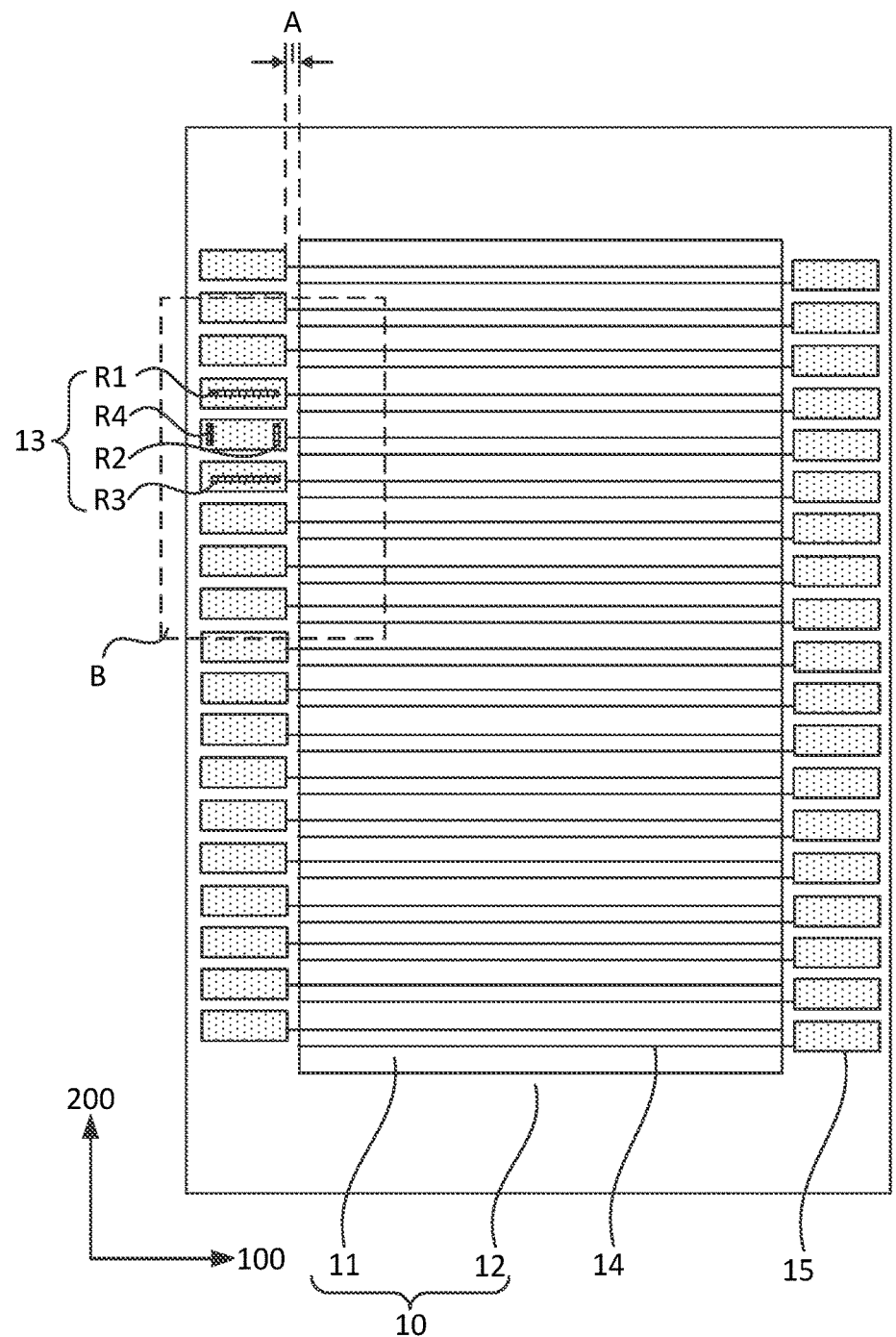
FIG. 3A is a structural diagram showing an array substrate according to an embodiment of the present disclosure.
Figure 3B:
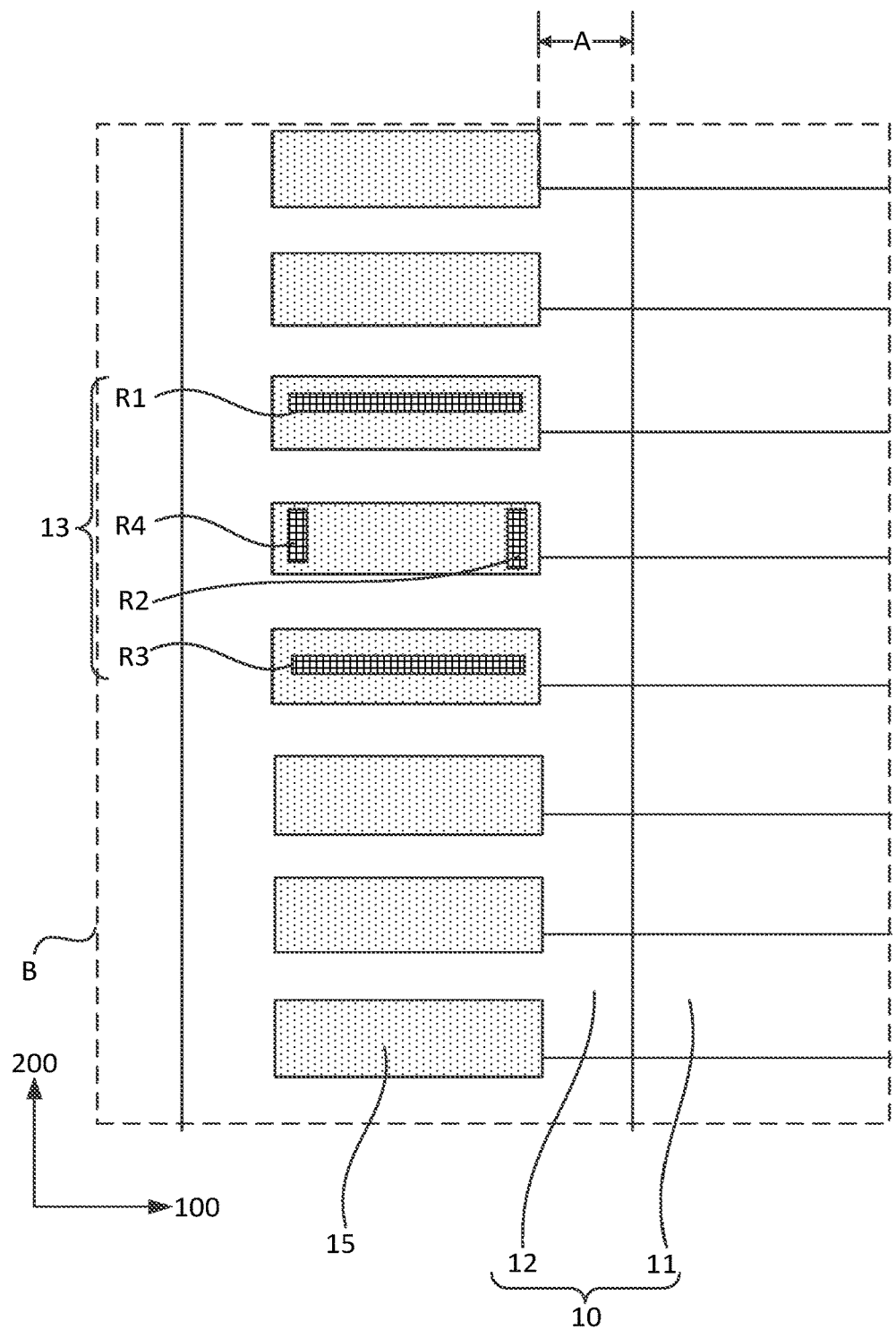
FIG. 3B is an enlarged drawing showing the region B in FIG. 3A.

Exemplarily, FIG. 3A is a structural diagram showing an array substrate according to an embodiment of the present disclosure. FIG. 3B is an enlarged drawing showing the region B in FIG. 3A. Referring to FIG. 3A and FIG. 3B, the array substrate includes a base substrate 10, and the base substrate 10 includes a display region 11 and a non-display region 12 surrounding the display region 11. The base substrate 10 further includes a first side extending in a first direction 100 and a second side extending in a second direction 200, and the first direction 100 and the second direction 200 are intersected with each other. At least a pressure sensor 13 is disposed in the non-display region 12 of the base substrate 10; and the pressure sensor 13 includes a first resistor R1, a second resistor R2, a third resistor R3 and a fourth resistor R4. A bridge structure is formed by the first resistor R1, the second resistor R2, the third resistor R3 and the fourth resistor R4; and the non-display region 12 of the based substrate 10 further includes a plurality of shift registers 15 successively arranged along the second direction 200, and a length of the shift register 15 in the first direction 100 is greater than that of the shift register in the second direction 200. The first resistor R1, the second resistor R2, the third resistor R3 and the fourth resistor R4 are all disposed inside the shift register 15.

The shift register 15 is formed by a plurality of components (e.g. a capacitor, a thin film transistor, and a resistor, etc.). The arrangement of the first resistor R1, the second resistor R2, the third resistor R3 and the fourth resistor R4 inside the shift register 15 refers to that, the first resistor R1, the second resistor R2, the third resistor R3 and the fourth resistor R4 are disposed in the gap between the adjacent two components. Comparing with the conventional array substrate (e.g. the array substrate shown in FIG. 1.) without a pressure sensor 13, the resistors for forming the pressure sensor 13 are disposed inside the shift register 15, so that the position of the shift register 15 does not need to be adjusted, and also the distance A between the edge of the shift register 15 close to the display region 11 and the boundary between the display region 11 and non-display region 12 does not need to be widened. Since the distance A between the edge of the shift register 15 close to the display region 11 and the boundary between the display region 11 and non-display region 12 does not need to be widened, as compared with the conventional array substrate (e.g. the array substrate shown in FIG. 2) with a pressure sensor, the resistors for forming the pressure sensor 13 are disposed inside the shift register 15, so that the area of the non-display region 12 of the display panel is decreased, thereby conforming to the developing trends of narrow-frame design.

Figure 4:
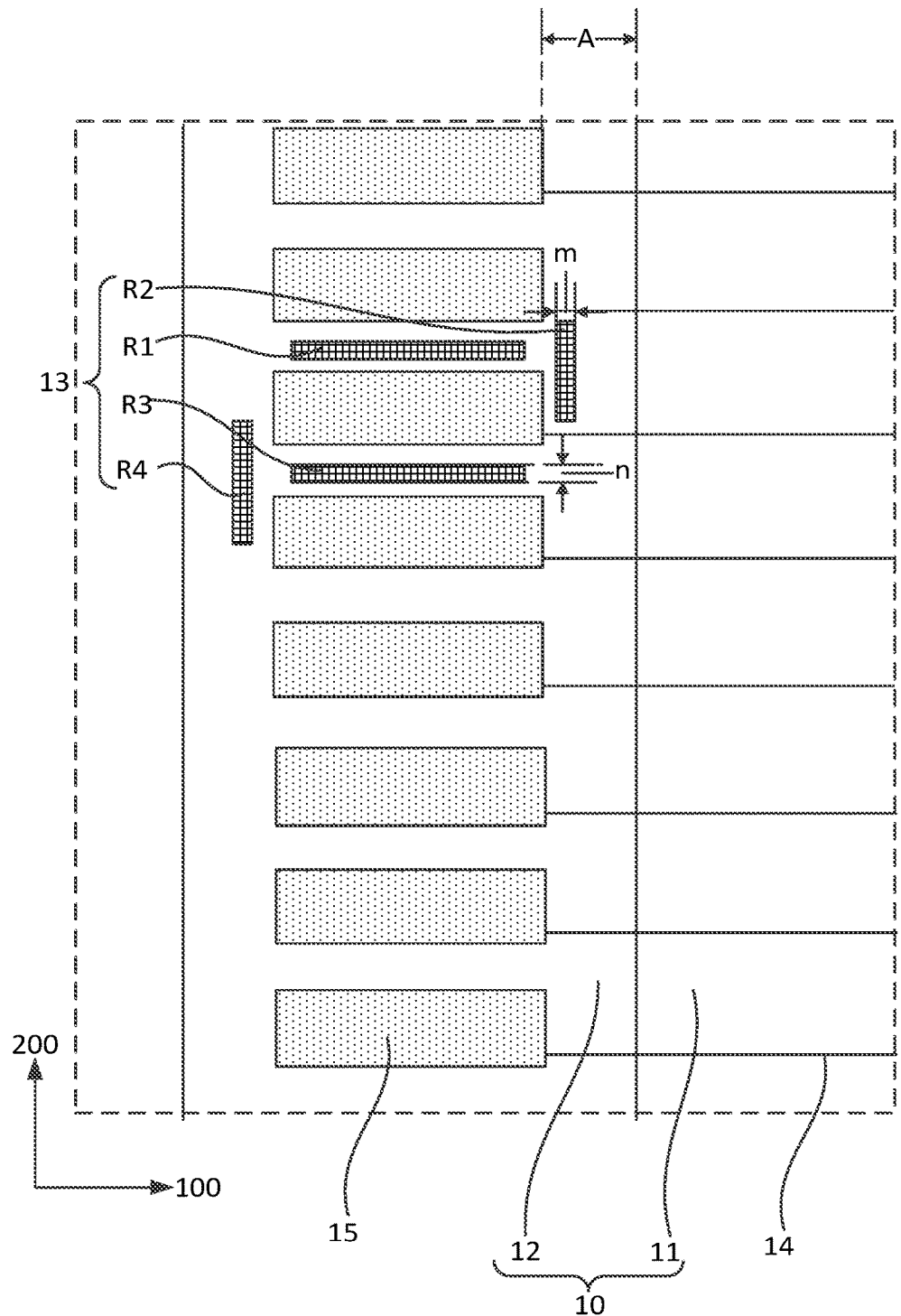
FIG. 4 is a partial structure diagram showing another array substrate according to an embodiment of the present disclosure.

FIG. 4 is a partial structure diagram showing another array substrate according to an embodiment of the present disclosure. Comparing with FIG. 3A and FIG. 3B, for the array substrate shown in FIG. 4, the positions of the resistors which form the pressure sensor 13 may be different from each other. Referring to FIG. 4, the first resistor R1 is disposed between adjacent two of the shift registers 15, and the second resistor R2 is disposed at a side of the shift register 15 close to the display region 11, and the third resistor R3 is disposed between adjacent two of the shift registers 15, and the fourth resistor R4 is disposed at a side of the shift register 15 away from the display region 11. Since the first resistor R1 and the third resistor R3 are disposed between adjacent two of the shift registers 15, the extension lengths of the first resistor R1 and the third resistor R3 along the first direction 100 is greater than those along the second direction 200. Since the second resistor R2 is disposed at a side of the shift register close to the display region, the extension length of the second resistor R2 along the second direction 200 is greater than that along the first direction 100.

Still referring to FIG. 4, the extension length of the resistor disposed between adjacent two of the shift registers 15 along the first direction 100 is greater than that along the second direction 200, which enables the resistor disposed between adjacent two of the shift registers 15 to be fully extended in the first direction 100, and the length n of the resistor in the second direction 200 may be decreased. It should be understood by those skilled in the related art, as compared with the conventional array substrate (e.g. the array substrate shown in FIG. 2) with a pressure sensor, the length n of the resistor disposed between adjacent two of the shift registers 15 in the second direction 200 is shorter, so that the space used for the resistor of the pressure sensor to be released by adjusting the position of the shift register 15 is smaller. Hence, after adjusting the position of the shift register 15, the probability of the misalignment between the signal outputting terminal of the shift register 15 and the corresponding scanning line 14 in the row direction is smaller. Thus, it is less likely to need bend the part of the scanning line 14 extended to the non-display region 12 to connect the scanning line 14 with the signal outputting terminal of the shift registers 15, which is benefit to decrease the distance A between the edge of the shift register 15 close to the display region 11 and the boundary between the display region 11 and non-display region 12, thereby conforming to the developing trends of narrow-frame design.

Still referring to FIG. 4, the extension length of the resistor disposed at a side of the shift register 15 close to the display region 11 along the second direction 200 is greater than that along the first direction 100, which enables the resistor disposed at a side of the shift register 15 close to the display region 11 to be fully extended in the second direction 200, and the length m of the resistor in the first direction 100 may be decreased. In such a way, the space between the shifter register 15 and the display region 11 may be fully utilized, so that the space used for the resistor of a pressure sensor to be released by adjusting the position of the shift register 15 can be decreased, and hence has little affection on the distance A between the edge of the shift register 15 close to the display region 11 and the boundary between the display region 11 and non-display region 12. Therefore, it is benefit to decrease the area of the non-display region 12 of the display panel, thereby conforming to the developing trends of narrow-frame design.

Still referring to FIG. 4, when the resistor which forms the pressure sensor is disposed at a side of the shift register 15 away from the display region 11, as compared with the conventional array substrate (e.g. the array substrate shown in FIG. 2) with a pressure sensor 13, the region used for the resistor of the pressure sensor to be released by adjusting the position of the shift register 15 does not need to be adjusted, and also the signal outputting terminal of the shift register 15 is not misaligned with the corresponding scanning line 14 in the row direction. Therefore, the distance A between the edge of the shift register 15 close to the display region 11 and the boundary between the display region 11 and non-display region 12 does not need to be widen, and hence the area of the non-display region 12 of the display panel is not increased, thereby conforming to the developing trends of narrow-frame design.

In summary, in the embodiment of the present disclosure, the first resistor, the second resistor, the third resistor and the fourth resistor are disposed at least one of: inside the shift register, between adjacent two of the shift registers, at a side of the shift register close to the display region, and at a side of the shift register away from the display region; and the extension length of the resistor disposed between adjacent two of the shift registers along the first direction is configured to be greater than that along the second direction, and the extension length of the resistor disposed at a side of the shift register close to the display region along the second direction is configured to be greater than that along the first direction, so that it solves the problem that the area of the non-display region of the display panel is increased due to adjustment of the position of the shift register and the widened distance between the edge of the shift register close to the display region and the boundary between the display region because of the excessive large size of the pressure sensor of the conventional display panel. In this embodiment, the decreased area of the non-display region of the display panel is achieved, thereby conforming to the developing trends of narrow-frame design.

In one embodiment, the first direction 100 is orthogonal to the second direction 200.

Figure 5:
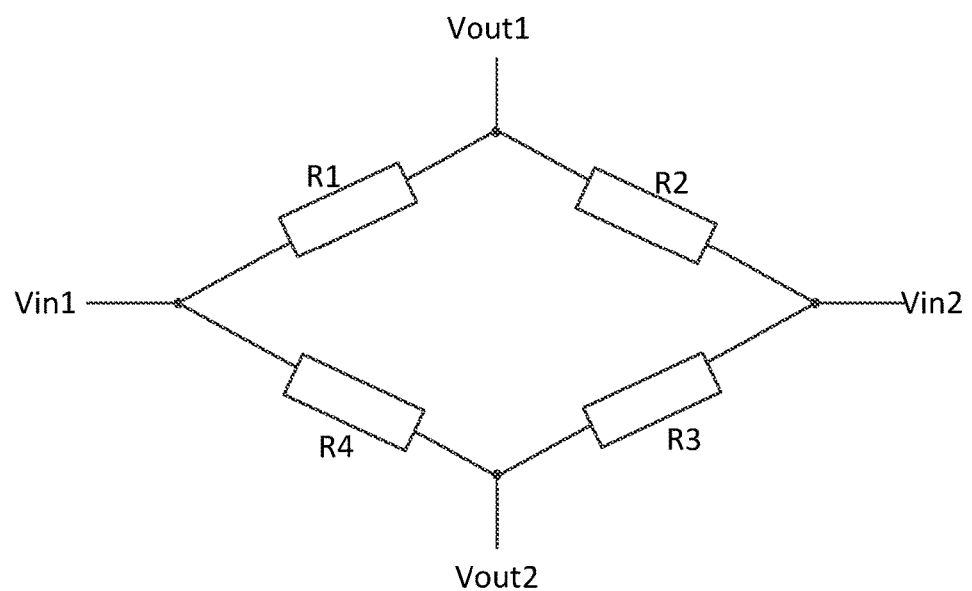
FIG. 5 is a diagram showing connecting relationship of a pressure sensor according to an embodiment of the present disclosure.

FIG. 5 is a diagram showing the connecting relationship of a pressure sensor according to an embodiment of the present disclosure. Referring to FIG. 5, the pressure sensor further includes a first power inputting terminal Vin1, a second power inputting terminal Vin2, a first induction signal measuring terminal Vout1 and a second induction signal measuring terminal Vout2. A first end of the first resistor R1 and a first end of the fourth resistor R4 are electrically connected to the first power inputting terminal Vin1, and a second end of the first resistor R1 and a first end of the second resistor R2 are electrically connected to the first induction signal measuring terminal Vout1, and a second end of the fourth resistor R4 and a first end of the third resistor R3 are electrically connected to the second induction signal measuring terminal Vout2, and a second end of the second resistor R2 and a second end of the third resistor R3 are electrically connected to second power inputting terminal Vin2; the first power inputting terminal Vin1 and the second power inputting terminal Vin2 are configured to provide a bias voltage signal to the pressure sensor; and the first induction signal measuring terminal Vout1 and the second induction signal measuring terminal Vout2 are configured to output a pressure detection signal from the pressure sensor.

Still referring to FIG. 5, a bridge is formed by the first resistor R1, the second resistor R2, the third resistor R3 and the fourth resistor R4. When the bias voltage signal is applied to the first power signal inputting terminal Vin1 and the second power signal inputting terminal Vin2, current flows through each of the branches of the bridge. At this moment, when the display panel with the array substrate is applied with a pressure, a shearing force from the corresponding position on the display panel is sensed, and the resistance of each of the internal resistors (including the first resistor R1, the second resistor R2, the third resistor R3 and the fourth resistor R4) of the pressure sensor is changed, so that the absolute value of the difference between the electric signals (namely pressure detection signals) respectively outputted from the first induction signal measuring terminal Vout1 and the second induction signal measuring terminal Vout2 of the pressure sensor 13 is different from the absolute value of the difference between the electric signals respectively outputted from the first induction signal measuring terminal Vout1 and the second induction signal measuring terminal Vout2 without the applied pressure. Therefore, the magnitude of the touch pressure may be determined.

It is known according to the operational principle of the bridge, in order to detect the magnitude of the touch pressure, the strains sensed by the first resistor R1, the second resistor R2, the third resistor R3 and the fourth resistor R4 may be different from each other.

For ease of understanding, assuming that the first power signal inputting terminal Vin1 of the pressure sensor is received a high voltage signal and the second power signal inputting terminal Vin2 of the pressure sensor is connected to the ground, and the resistances of the first resistor R1, the second resistor R2, the third resistor R3 and the fourth resistor R4 are equal to each other before a pressing operation. That is, the absolute value of the difference between the electric signals (namely pressure detection signals) respectively outputted from the first induction signal measuring terminal Vout1 and the second induction signal measuring terminal Vout2 of the pressure sensor 13 without a pressing operation is zero.

If in a comparison of a state of post-pressing operation (that is, a state after a pressing operation) with a state of pre-pressing operation (that is, a state before a pressing operation), a resistance variation of the first resistor R1 is larger than that of the second resistor R2, and a resistance variation of the third resistor R3 is approximate to that of the fourth resistor R4, then comparing with the state of pre-pressing operation, the voltage component on the first resistor R1 is increased and the voltage component on the second resistor R2 is decreased, and the potential of the first induction signal measuring terminal Vout1 is decreased and the potential of the second induction signal measuring terminal Vout2 keeps unchanged in the state of post-pressing operation, so that the absolute value of the difference between the electric signals (namely pressure detection signals) respectively outputted from the first induction signal measuring terminal Vout1 and the second induction signal measuring terminal Vout2 of the pressure sensor 13 would be increased.

Similarly, if in a comparison of the state of post-pressing operation with the state of pre-pressing operation, the resistance variation of the first resistor R1 is approximate to that of the second resistor R2 and resistance variation of the third resistor R3 is larger than that of the fourth resistor R4, then the voltage component on the third resistor R3 is increased and the voltage component on the fourth resistor R4 is decreased, and the potential of the first induction signal measuring terminal Vout1 keeps unchanged and the potential of the second induction signal measuring terminal Vout2 is increased in the state of post-pressing operation, so that the absolute value of the difference between the electric signals (namely pressure detection signals) respectively outputted from the first induction signal measuring terminal Vout1 and the second induction signal measuring terminal Vout2 of the pressure sensor 13 would be increased.

Similarly, if in a comparison of the state of post-pressing operation with the state of pre-pressing operation, the resistance variation of the first resistor R1 is larger than that of the second resistor R2, and resistance variation of the third resistor R3 is larger than that of the fourth resistor R4, then the voltage component on the first resistor R1 is increased and the voltage component on the second resistor R2 is decreased, and the potential of the first induction signal measuring terminal Vout1 is decreased; and also the voltage component on the third resistor R3 is increased and the voltage component on the fourth resistor R4 is decreased, and the potential of the second induction signal measuring terminal Vout2 is increased in the state of post-pressing operation, so that the absolute value of the difference between the electric signals (namely pressure detection signals) respectively outputted from the first induction signal measuring terminal Vout1 and the second induction signal measuring terminal Vout2 of the pressure sensor 13 would also be increased beneficially.

If in a comparison of the state of post-pressing operation with the state of pre-pressing operation, the variation of pressure detection signals outputted from the pressure sensor is large, then it is favorable for the sensitivity improvement of touch pressure detection of the display panel. Based on above, it should be understood by those skilled that, to improve the sensitivity of the pressure detection of the display panel, in one embodiment, the material, the size and the extension direction of the first resistor R1 and the second resistor R2 can be adjusted, so that:

the resistance variation of the first resistor R1 is larger than that of the second resistor R2, and resistance variation of the third resistor R3 is approximate to that of the second resistor R4, in a comparison of the state of post-pressing operation with the state of pre-pressing operation; or, the resistance variation of the first resistor R1 is approximate to that of the second resistor R2, and resistance variation of the third resistor R3 is larger than that of the second resistor R4, in a comparison of the state of post-pressing operation with the state of pre-pressing operation; or, the resistance variation of the first resistor R1 is larger than that of the second resistor R2, and resistance variation of the third resistor R3 is larger than that of the second resistor R4, in a comparison of the state of post-pressing operation with the state of pre-pressing operation; or, the resistance variation of the first resistor R1 is smaller than that of the second resistor R2, and resistance variation of the third resistor R3 is approximate to that of the second resistor R4, in a comparison of the state of post-pressing operation with the state of pre-pressing operation; or, the resistance variation of the first resistor R1 is approximate to that of the second resistor R2, and resistance variation of the third resistor R3 is smaller than that of the second resistor R4, in a comparison of the state of post-pressing operation with the state of pre-pressing operation; or, the resistance variation of the first resistor R1 is smaller than that of the second resistor R2, and resistance variation of the third resistor R3 is smaller than that of the second resistor R4, in a comparison of the state of post-pressing operation with the state of pre-pressing operation.

In this embodiment, the material of the first resistor R1, the second resistor R2, the third resistor R3 and the fourth resistor R4 may be metal. Further, since the strain sensitivity of the metallic material is smaller one order of magnitude than that of the semiconductor material with, the material of the first resistor R1, the second resistor R2, the third resistor R3 and the fourth resistor R4 may be amorphous silicon material and polysilicon material. Further, the first resistor R1, the second resistor R2, the third resistor R3 and the fourth resistor R4 may be a P-type resistor or an N-type resistor.

TABLE 1

|  | P-type resistor | | N-type resistor | |
| --- | --- | --- | --- | --- |
|  | Ra(kΩ) | Rb(kΩ) | Rb(kΩ) | Ra(kΩ) |
| pre-pressing | 23.824 | 23.831 | 22.573 | 22.631 |
| post-pressing | 23.873 | 23.837 | 22.598 | 22.617 |
| resistance variation | 0.049 | 0.006 | 0.025 | −0.014 |

Figure 6:
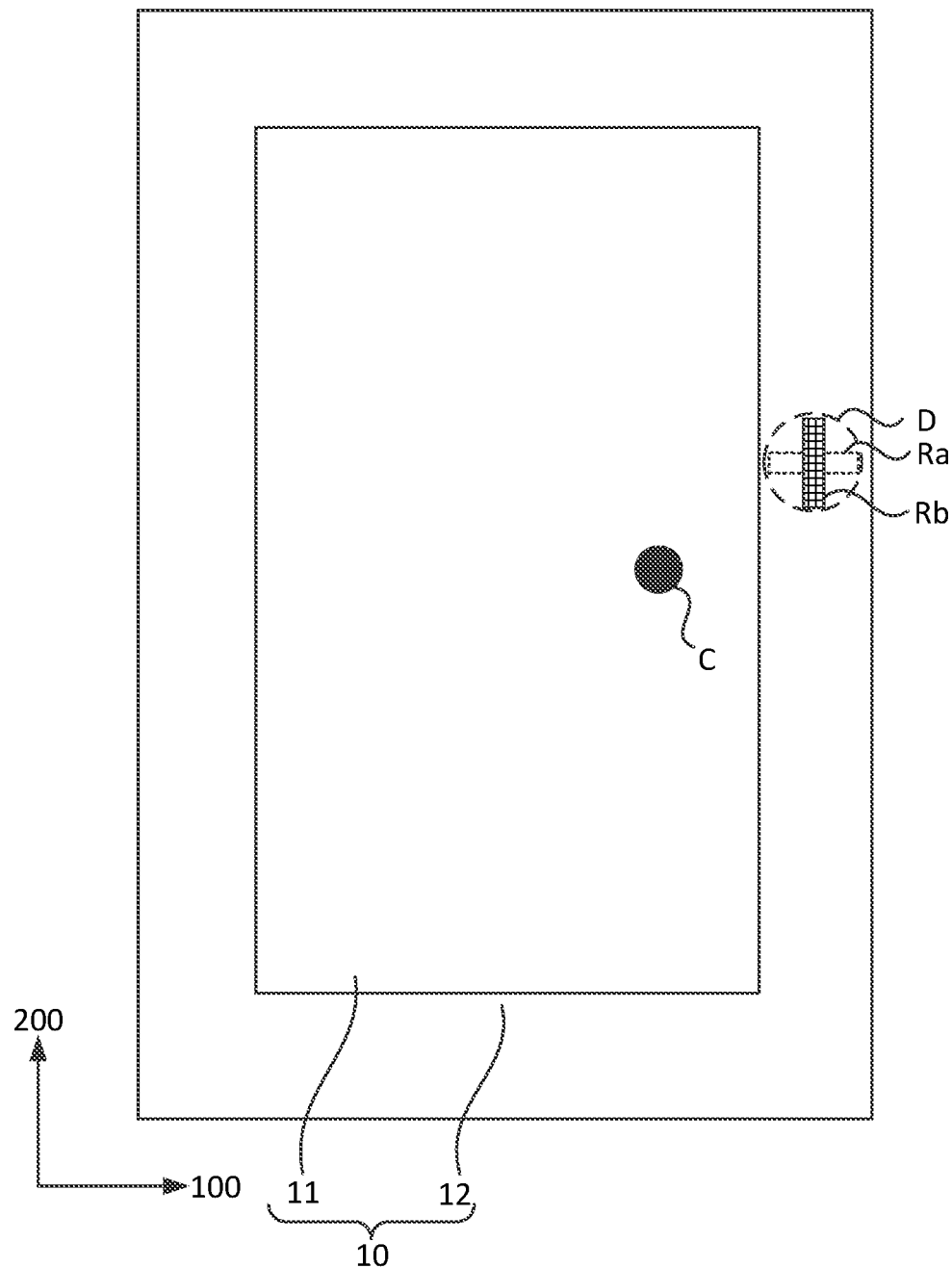
FIG. 6 is a structural diagram showing another array substrate according to an embodiment of the present disclosure.

FIG. 6 is a structural diagram showing another array substrate according to an embodiment of the present disclosure. Referring to FIG. 6, it is disposed within an region D a resistor Rb of which the extension length in the second direction 200 is greater than that in the first direction 100, or a resistor Ra of which the extension length in the first direction 100 is greater than that in the second direction 200, in order to determine the magnitude of the touch pressure in the point C in the display region 11 of the array substrate touched by a pressing operation, and the research on the resistance variations of the resistor Ra and the resistor Rb in a comparison of is conducted, and the results thereof are given in Table 1. Referring to Table 1, in a comparison of the state of post-pressing operation with the state of pre-pressing operation, if the resistor Ra and the resistor Rb are P-type resistors, the resistance variation of the resistor Ra is larger than that of the resistor Rb; If the resistor Ra and the resistor Rb are N-type resistors, the resistance variation of the resistor Ra is smaller than that of the resistor Rb.

Figure 7:
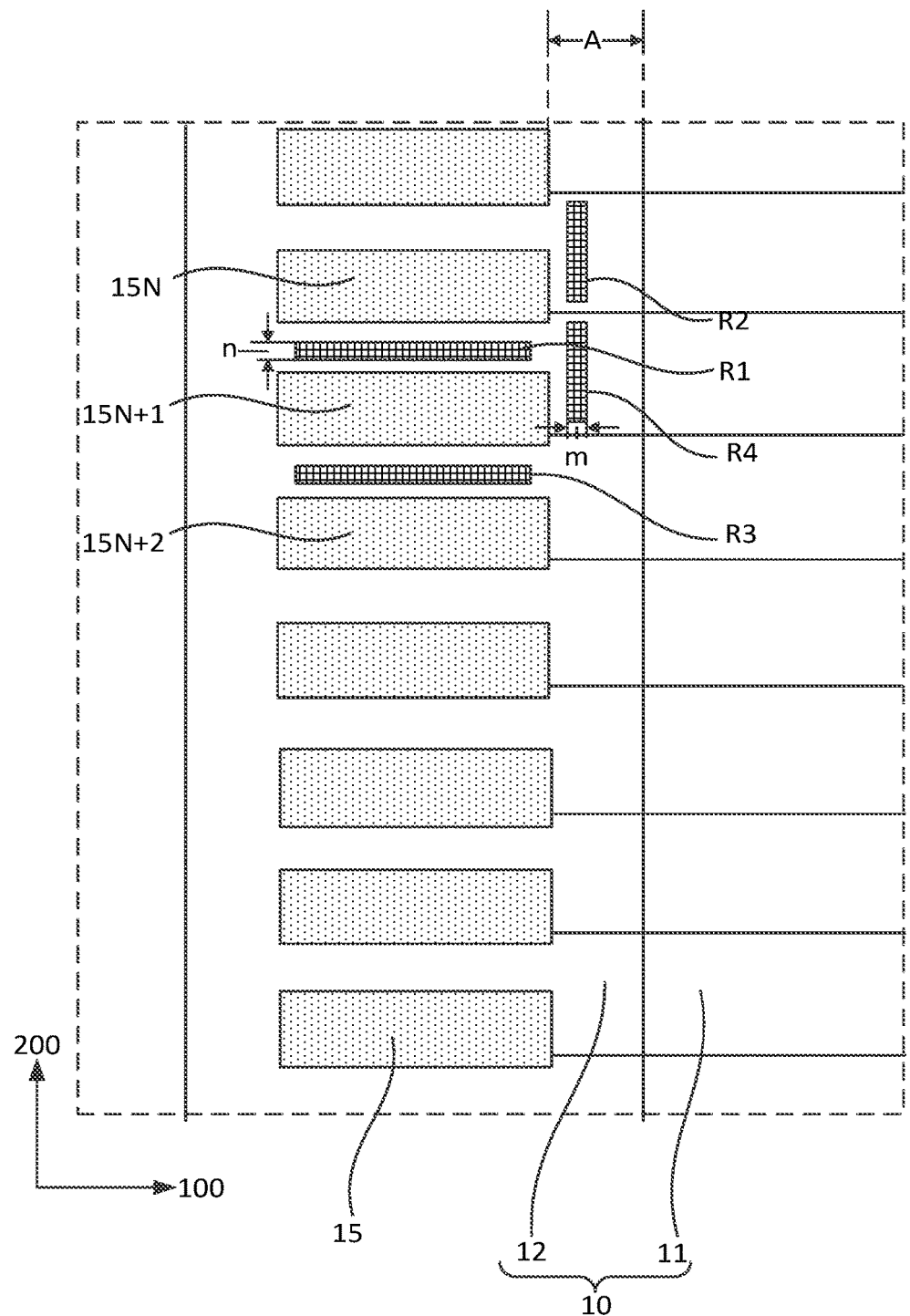
FIG. 7 is a partially structural diagram showing another array substrate according to an embodiment of the present disclosure.

Therefore, in one embodiment, as shown in FIG. 7, the first resistor R1, the second resistor R2, the third resistor R3 and the fourth resistor R4 each are P-type resistors or N-type resistors; the extension lengths of the first resistor R1 and the third resistor R3 in the first direction 100 are greater than those in the second direction 200, and the extension lengths of the second resistor R2 and the fourth resistor R4 in the second direction 200 are greater than those in the first direction 100. As such, the strain in the first direction 100 may be sensed by the first resistor R1 and the third resistor R3, the strain in the second direction 200 may be sensed by the second resistor R2 and the fourth resistor R4.

In combination with Table 1, if the first resistor R1, the second resistor R2, the third resistor R3 and the fourth resistor R4 each are P-type resistors, the resistance variation of the first resistor R1 is larger than that of the second resistor R2, and resistance variation of the third resistor R3 is larger than that of the second resistor R4 in a comparison of the state of post-pressing operation with the state of pre-pressing operation, it is benefit to increase the variations of the pressure detection signals respectively outputted from the first induction signal measuring terminal Vout1 and the second induction signal measuring terminal Vout2, thereby improving the sensitivity of touch pressure detection of the display panel. If the first resistor R1, the second resistor R2, the third resistor R3 and the fourth resistor R4 each are N-type resistors, the resistance variation of the first resistor R1 is smaller than that of the second resistor R2, and resistance variation of the third resistor R3 is smaller than that of the second resistor R4 in a comparison of the state of post-pressing operation with the state of pre-pressing operation, it is benefit to increase the variations of the pressure detection signals respectively outputted from the first induction signal measuring terminal Vout1 and the second induction signal measuring terminal Vout2, thereby improving the sensitivity of touch pressure detection of the display panel.

Still referring to FIG. 7, in one embodiment, M shift registers are disposed at a side of the non-display region 12 of the base substrate 10, and the M shift registers include a N-th stage of shift register 15N, a N+1-th stage of shift register 15N+1 and a N+2-th stage of shift register 15N+2; and the first resistor R1 is disposed between the N-th stage of shift register 15N and the N+1-th stage of shift register 15N+1, and the third resistor R3 is disposed between the N+1-th stage of shift register 15N+1 and the N+2-th stage of shift register 15N+2; the second resistor R2 is disposed between the N-th stage of shift register 15N and the display region 11 and the fourth resistor R4 is disposed between the N+1-th stage of shift register 15N+1 and the display region 11. Or, the second resistor R2 is disposed between the N+1-th stage of shift register 15N+1 and the display region 11, and the fourth resistor R4 is disposed between the N+2-th stage of shift register 15N+2 and the display region 11; and M is a positive integer not less than three, N is a positive integer not less than one and not larger than M−2. As such, the positions of the first resistor R1, the second resistor R2, the third resistor R3 and the fourth resistor R4 is relatively concentrated, so that the first resistor R1, the second resistor R2, the third resistor R3 and the fourth resistor R4 have synchronous temperature change, thereby eliminating the affection caused by the temperature difference and hence improving the sensing accuracy of pressure detection.

Figure 8:
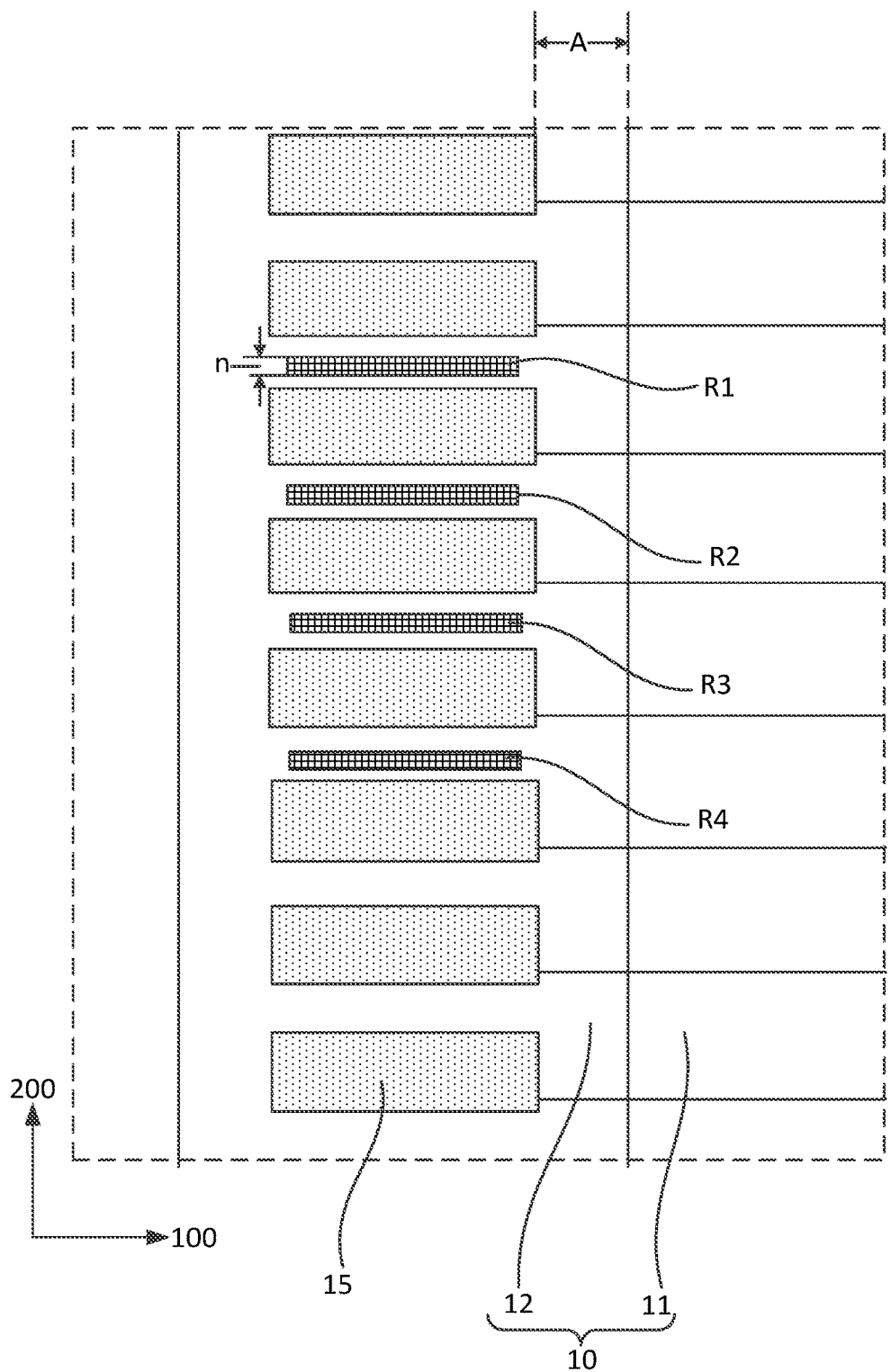
FIG. 8 is a partially structural diagram showing another array substrate according to an embodiment of the present disclosure.

FIG. 8 is a partially structural diagram showing another array substrate according to an embodiment of the present disclosure. Referring to FIG. 8, a pressure sensor in the array substrate is formed by the first resistor R1, the second resistor R2, the third resistor R3 and the fourth resistor R4, and the first resistor R1 and the third resistor R3 both are P-type resistors and the second resistor R2 and the fourth resistor R4 both are N-type resistors; the extension lengths of the first resistor R1, the second resistor R2, the third resistor R3 and the fourth resistor R4 in the first direction 100 is greater than those in the second direction 200. As such, the strain in the second direction 100 may be sensed by the first resistor R1, the second resistor R2, the third resistor R3 and the fourth resistor R4. In combination with Table 1, in a comparison of the state of post-pressing operation with the state of pre-pressing operation, the resistance variation of the first resistor R1 is larger than that of the second resistor R2, and resistance variation of the third resistor R3 is larger than that of the second resistor R4, so that it is benefit to increase the variations of the pressure detection signals respectively outputted from the first induction signal measuring terminal Vout1 and the second induction signal measuring terminal Vout2, thereby improving the sensitivity of touch pressure detection of the display panel.

Figure 9:
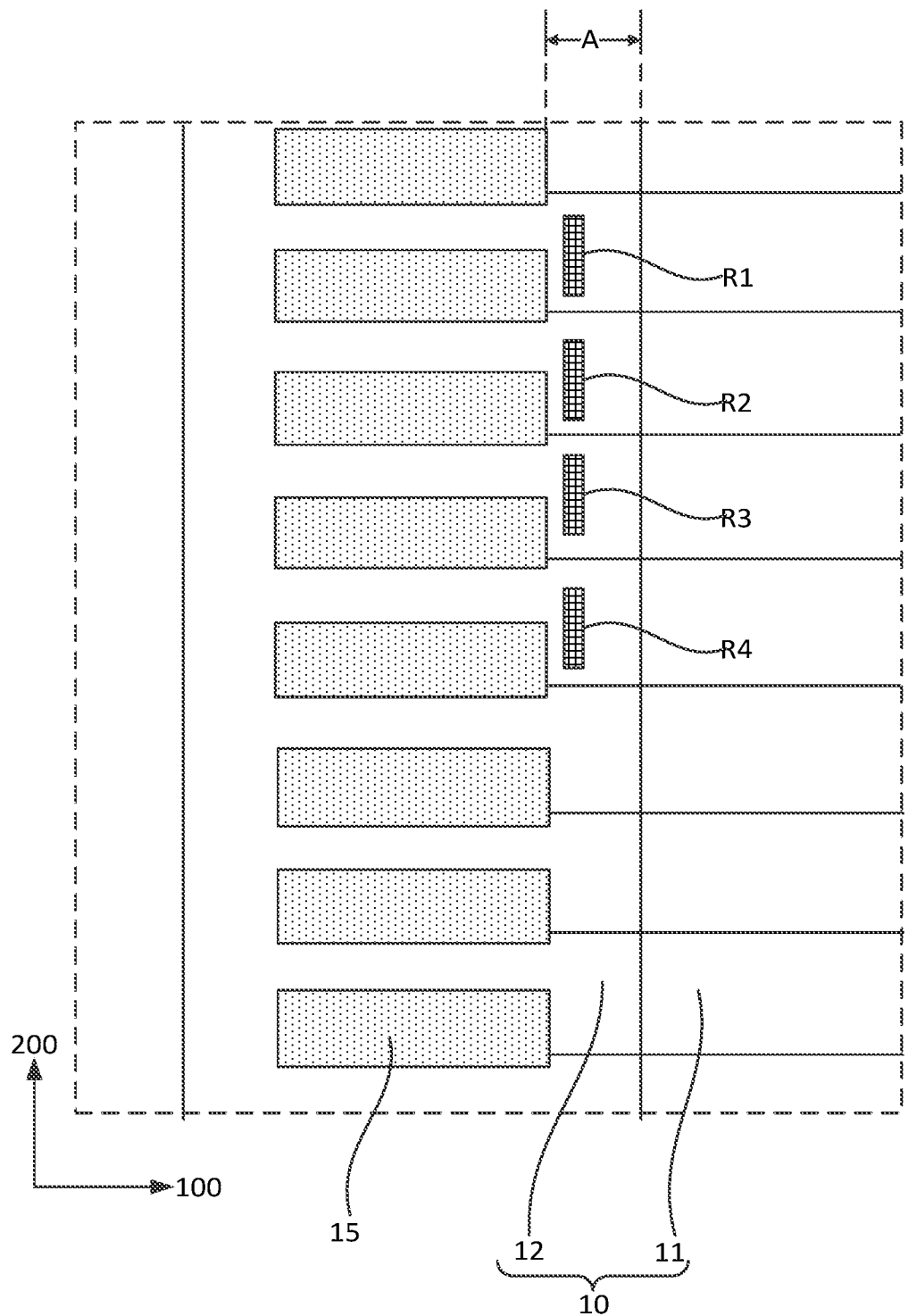
FIG. 9 is a partially structural diagram showing another array substrate according to an embodiment of the present disclosure.

FIG. 9 is a partially structural diagram showing another array substrate according to an embodiment of the present disclosure. Referring to FIG. 9, a pressure sensor in the array substrate is formed by the first resistor R1, the second resistor R2, the third resistor R3 and the fourth resistor R4, and the first resistor R1 and the third resistor R3 both are P-type resistors, and the second resistor R2 and the fourth resistor R4 both are N-type resistors; the extension lengths of the first resistor R1, the second resistor R2, the third resistor R3 and the fourth resistor R4 in the second direction 200 is greater than those in the first direction 100. As such, the strain in the second direction 200 may be sensed by the first resistor R1, the second resistor R2, the third resistor R3 and the fourth resistor R4. In combination with Table 1, in a comparison of the state of post-pressing operation with the state of pre-pressing operation, the resistance variation of the first resistor R1 is smaller than that of the second resistor R2, and resistance variation of the third resistor R3 is smaller than that of the second resistor R4, so that it is benefit to increase the variations of the pressure detection signals respectively outputted from the first induction signal measuring terminal Vout1 and the second induction signal measuring terminal Vout2, thereby improving the sensitivity of touch pressure detection of the display panel.

Figure 10:
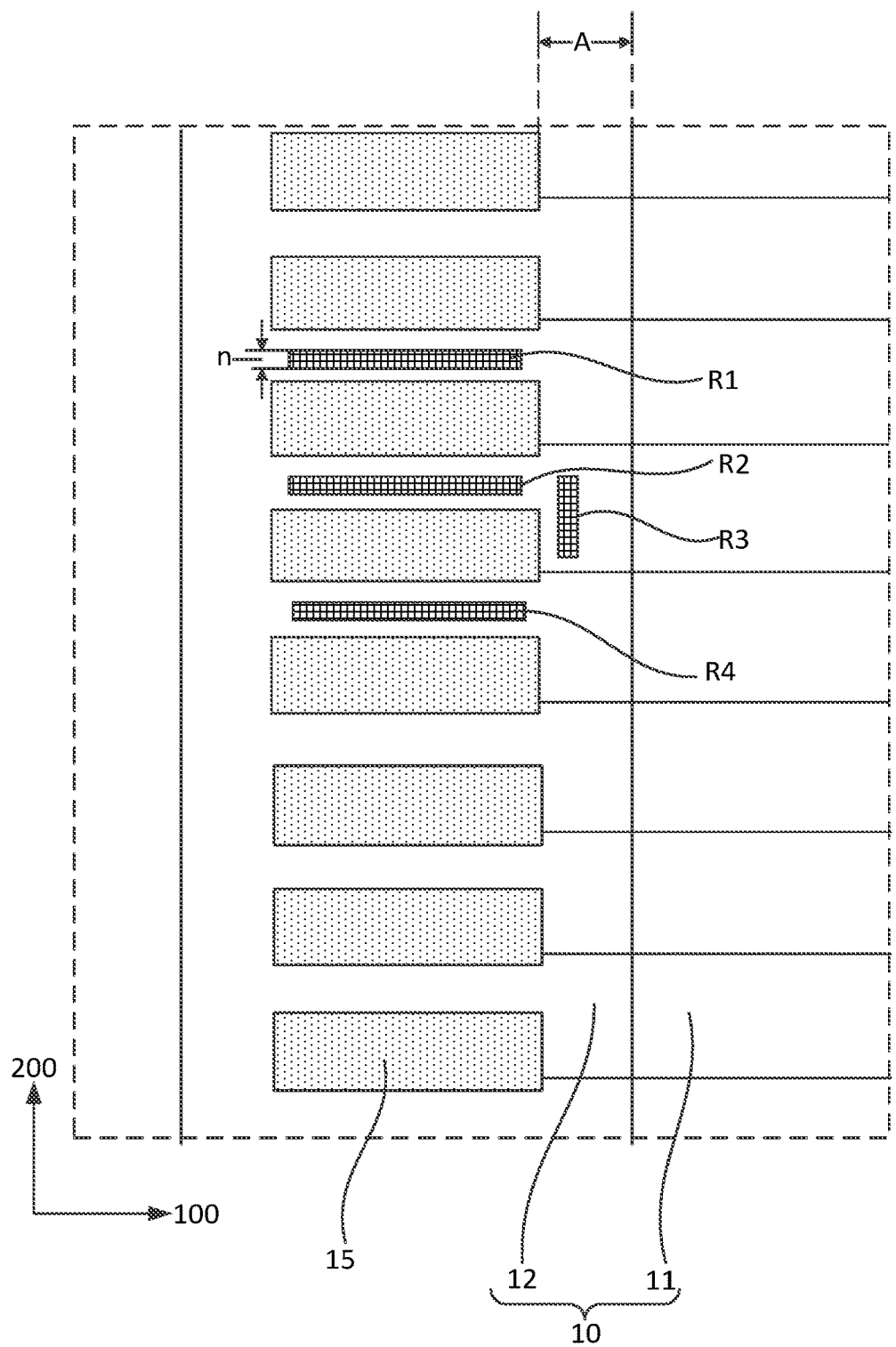
FIG. 10 is a partially structural diagram showing another array substrate according to an embodiment of the present disclosure.

FIG. 10 is a partially structural diagram showing another array substrate according to an embodiment of the present disclosure. Referring to FIG. 10, a pressure sensor in the array substrate is formed by the first resistor R1, the second resistor R2, the third resistor R3 and the fourth resistor R4, and the first resistor R1 is a P-type resistor and the second resistor R2, the third resistor R3 and the fourth resistor R4 all are N-type resistors; or, the first resistor R1 is an N-type resistor, and the second resistor R2 the third resistor R3 and the fourth resistor R4 all are P-type resistors. The extension lengths of the first resistor R1, the second resistor R2 and the fourth resistor R4 in the first direction 100 is greater than those in the second direction 200, and the extension length of the third resistor R3 in the second direction 200 is greater than that in the first direction 100. That is, the strain in the first direction 100 may be sensed by the first resistor R1, the second resistor R2 and the fourth resistor R4, and the strain in the second direction 200 may be sensed by the third resistor R3.

In combination with Table 1, if the first resistor R1 is a P-type resistor, and the second resistor R2, the third resistor R3 and the fourth resistor R4 all are N-type resistors, the resistance variation of the first resistor R1 is larger than that of the second resistor R2, and resistance variation of the third resistor R3 is larger than that of the second resistor R4, in a comparison of the state of post-pressing operation with the state of pre-pressing operation, so that it is benefit to increase the variations of the pressure detection signals respectively outputted from the first induction signal measuring terminal Vout1 and the second induction signal measuring terminal Vout2, thereby improving the sensitivity of touch pressure detection of the display panel. If the first resistor R1 is an N-type resistor, and the second resistor R2, the third resistor R3 and the fourth resistor R4 all are P-type resistors, the resistance variation of the first resistor R1 is smaller than that of the second resistor R2, and resistance variation of the third resistor R3 is smaller than that of the second resistor R4 in a comparison of the state of post-pressing operation with the state of pre-pressing operation, so that it is benefit to increase the variation of the pressure detection signals respectively outputted from the first induction signal measuring terminal Vout1 and the second induction signal measuring terminal Vout2, thereby improving the sensitivity of touch pressure detection of the display panel.

Figure 11:
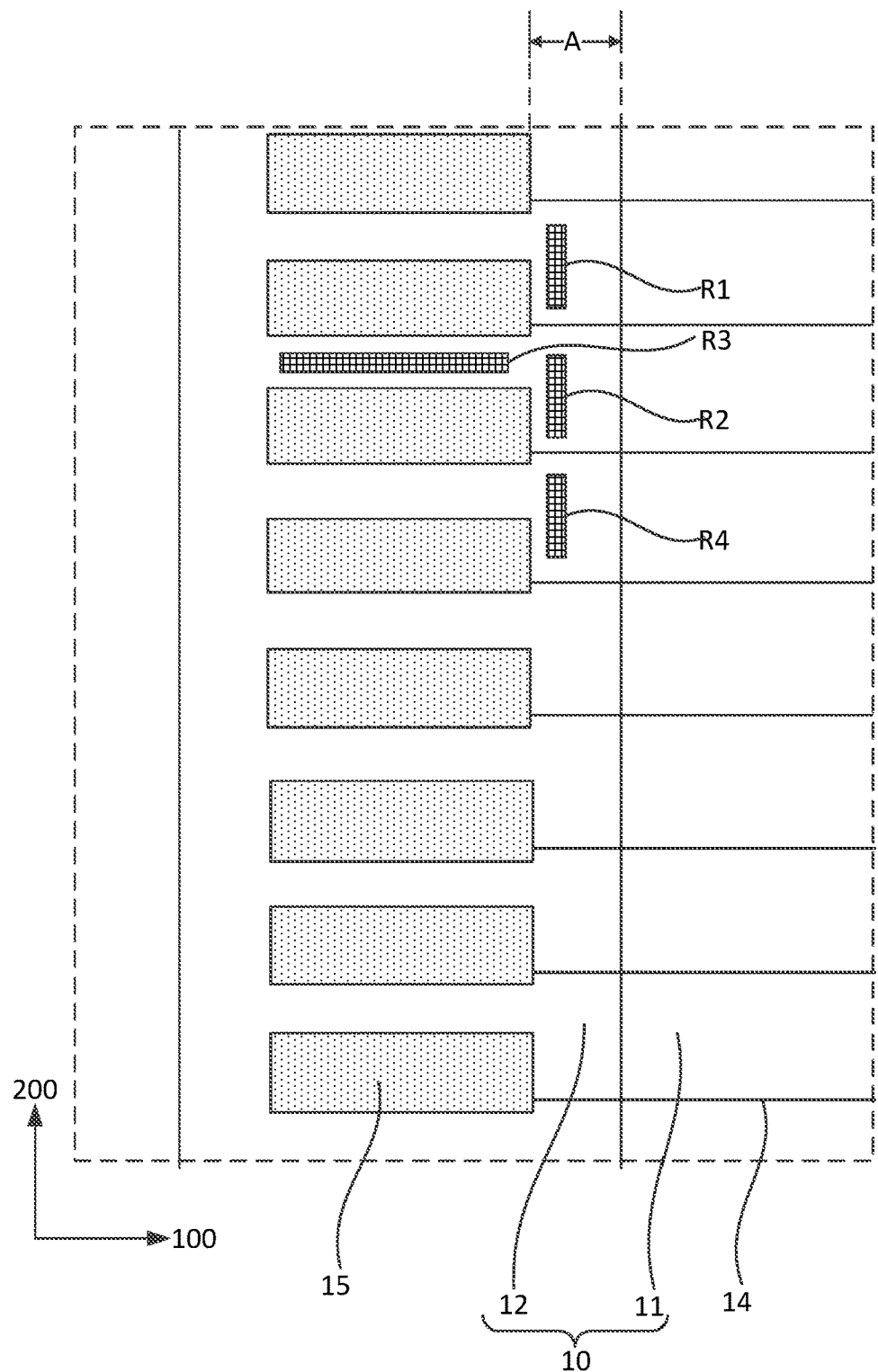
FIG. 11 is a partially structural diagram showing another array substrate according to an embodiment of the present disclosure.

FIG. 11 is a partially structural diagram showing another array substrate according to an embodiment of the present disclosure. Referring to FIG. 11, a pressure sensor in the array substrate is formed by the first resistor R1, the second resistor R2, the third resistor R3 and the fourth resistor R4, and the first resistor R1 is a P-type resistor and the second resistor R2 the third resistor R3 and the fourth resistor R4 all are N-type resistors; or, the first resistor R1 is an N-type resistor, and the second resistor R2, the third resistor R3 and the fourth resistor R4 all are P-type resistors. the extension lengths of the first resistor R1, the second resistor R2 and the fourth resistor R4 in the second direction 200 are greater than those in the first direction 100, and the extension length of the third resistor R3 in the first direction 100 is greater than that in the second direction 200. That is, the strain in the second direction 200 may be sensed by the first resistor R1, the second resistor R2 and the fourth resistor R4, and the strain in the first direction 100 may be sensed by the third resistor R3.

In combination with Table 1, if the first resistor R1 is a P-type resistor, and the second resistor R2, the third resistor R3 and the fourth resistor R4 all are N-type resistors, the resistance variation of the first resistor R1 is smaller than that of the second resistor R2, and resistance variation of the third resistor R3 is smaller than that of the second resistor R4, in a comparison of the state of post-pressing operation with the state of pre-pressing operation, so that it is benefit to increase the variations of the pressure detection signals respectively outputted from the first induction signal measuring terminal Vout1 and the second induction signal measuring terminal Vout2, thereby improving the sensitivity of touch pressure detection of the display panel. If the first resistor R1 is an N-type resistor, and the second resistor R2, the third resistor R3 and the fourth resistor R4 all are P-type resistors, the resistance variation of the first resistor R1 is larger than that of the second resistor R2, and resistance variation of the third resistor R3 is larger than that of the second resistor R4, in a comparison of the state of post-pressing operation with the state of pre-pressing operation, so that it is benefit to increase the variations of the pressure detection signals respectively outputted from the first induction signal measuring terminal Vout1 and the second induction signal measuring terminal Vout2, thereby improving the sensitivity of touch pressure detection of the display panel.

In an embodiment, a pressure sensor in the array substrate is formed by the first resistor R1, the second resistor R2, the third resistor R3 and the fourth resistor R4, and the first resistor R1 is a P-type resistor, and the second resistor R2, the third resistor R3 and the fourth resistor R4 all are N-type resistors; or, the first resistor R1 is an N-type resistor, and the second resistor R2, the third resistor R3 and the fourth resistor R4 all are P-type resistors. The extension lengths of the first resistor, the second resistor, the third resistor and the fourth resistor in the first direction are greater than those in the second direction; or, the extension lengths of the first resistor, the second resistor, the third resistor and the fourth resistor in the second direction are greater than those in the first direction. One advantage of the above configuration lies in that the variations of the pressure detection signals respectively outputted from the first induction signal measuring terminal Vout1 and the second induction signal measuring terminal Vout2 are increased, thereby improving the sensitivity of touch pressure detection of the display panel.

In one embodiment, the resistance ratio of the first resistor R1 to the second resistor R2 is equal to that of the third resistor R3 to the fourth resistor R4. One advantage of the above configuration lies in that, when a bias voltage signal is applied on the pressure sensor 13 and the resistances of the first resistor R1, the second resistor R2, the third resistor R3 and the fourth resistor R4 are satisfied with above relationship, the voltage component of the first resistor R1 is equal to that of the fourth resistor R4 and the voltage component of the second resistor R2 is equal to that of the third resistor R3 when there is no pressing operation. The potential of the first induction signal measuring terminal Vout1 is equal to that of the second induction signal measuring terminal Vout2 of the pressure sensor, and pressure detection signals respectively outputted from the first induction signal measuring terminal Vout1 and the second induction signal measuring terminal Vout2 of the pressure sensor are zero. The pressure detection signal outputted by the pressure sensor 13 when there is a pressing operation is equal to the variation of the pressure detection signal outputted by the pressure sensor 13 in a comparison of the state of post-pressing operation with the state of pre-pressing operation. It is benefit to simplify the calculating process of the touch pressure value and reduce the response time of the corresponding operations performed by the display panel according to the magnitude of the touch pressure.

In above embodiments, typically, the resistance of the first resistor R1, the second resistor R2, the third resistor R3 and the fourth resistor R4 is equal to each other. As such, when the pressure is not applied, the potential of the first induction signal measuring terminal Vout1 is equal to that of the second induction signal measuring terminal Vout2, and pressure detection signals outputted from the first induction signal measuring terminal Vout1 and the second induction signal measuring terminal Vout2 are zero, which is benefit to simplify the calculating process of the touch pressure value and reduce the response time of the corresponding operations performed by the display panel according to the magnitude of the touch pressure.

Further, according to equation $$R = \rho \frac{l}{S},$$

and R is the resistance of the resistor, and ρ is the resistivity of the material of the resistor, and l is the length of the resistor along the flowing direction of the current, and S is the cross section of the resistor orthogonal to the flowing direction of the current. Since the pressure sensor provided by the present disclosure is formed by the first resistor R1, the second resistor R2, the third resistor R3 and the fourth resistor R4, the ratio of the length l of the first resistor R1, the second resistor R2, the third resistor R3 and the fourth resistor R4 along the flowing direction of the current to the cross section S of the first resistor R1, the second resistor R2, the third resistor R3 and the fourth resistor R4 orthogonal to the flowing direction of the current can be adjusted flexibly, thereby increasing the resistance of the pressure sensor provided by the present disclosure and fully reducing the distance A between the edge of the shift register 15 close to the display region 11 and the boundary between the display region 11 and non-display region 12. In such a way, the area of the non-display region 12 of the display panel is not increased, which is favorable to the developing trends of narrow-frame design.

Still referring to FIG. 11, the array substrate includes a plurality of scanning lines 14, and each of shift registers 15 are electrically connected to at least one of the the scanning lines 14. In the case that the projection of the resistor disposed between the shift register 15 and the display region 11 on the base substrate 10 is overlapped with the projection of the scanning line 14 on the base substrate 10, the scanning line 14 is equivalent to a gate electrode of the thin film transistor, the resistor disposed between the shift register 15 and the display region 11 is equivalent to channel region of the thin film transistor, so that the magnitude of the signal transmitted on the scanning line 14 may affect turning-on and turning-off of the channel region, and further affecting the working state of the pressure sensor 13. Therefore, in an embodiment, the projection of the resistor disposed between the shift register 15 and the display region 11 on the base substrate 10 is not overlapped with the projection of the scanning line 14 on the base substrate 10. In such a way, it ensures that the working state of the pressure sensor 13 is not affected by the signal transmitted in the scanning line 14.

In an embodiment, the display panel includes at least a thin film transistor (TFT), and the TFT includes an active layer; the first resistor R1, the second resistor R2, the third resistor R3 and the fourth resistor R4 of the pressure sensor 13 and the active layer of the TFT may be disposed in the same layer. One advantage of the above configuration lies in that the first resistor R1, the second resistor R2, the third resistor R3 and the fourth resistor R4 of the pressure sensor 13 and the active layer of the TFT may be fabricated at the same process, thereby reducing the number of the processes, simplifying the manufacturing process and reducing the production cost. The TFT may be disposed within the display region 11 of the array substrate, to control the display unit to perform image display; and the TFT may also be integrated inside the shift register, to form a scanning signal.

Figure 12:
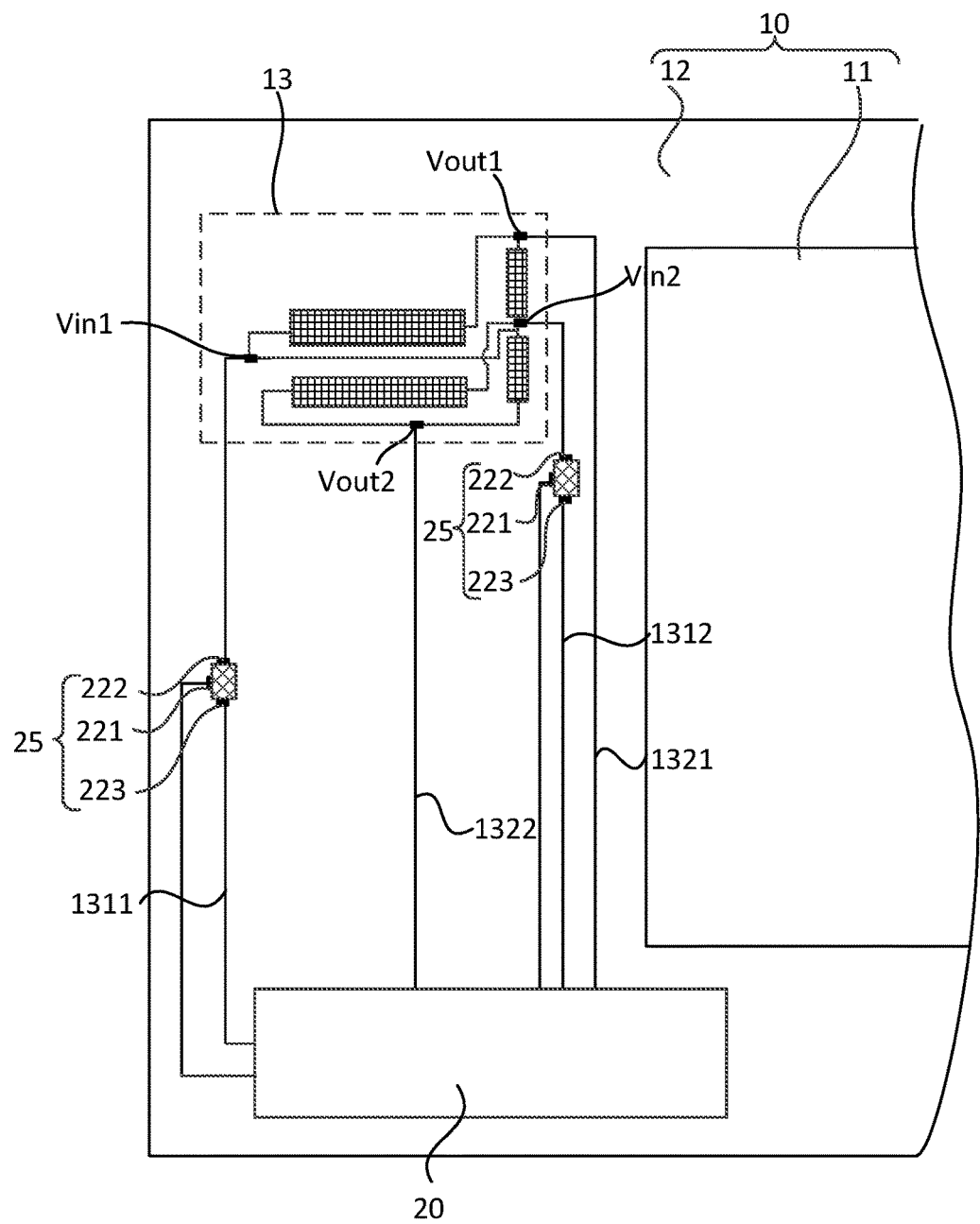
FIG. 12 is a partially structural diagram showing another array substrate according to an embodiment of the present disclosure.

FIG. 12 is a structural diagram for another display panel provided by the embodiments of the present disclosure. Referring to FIG. 12, the array substrate includes a control switch 25 electrically connected to the pressure sensor 13, to control the working state of each of the pressure sensors 13. Since the control switch 25 is disposed in the display panel and configured to electrically connect to the pressure sensor 13, the pressure sensors 13 of the array substrate can be worked independently, thereby flexibly adjusting the working state of each of the pressure sensors 13 based on the factors such as touch position, and the strength of the pressure detection signal etc., so as to decrease the power consumption of the array substrate. In one embodiment, there are various structures for the control switch. Detailed descriptions on the typical examples are given as follows, but it is not intend to limit the present disclosure.

Still referring to FIG. 12, the array substrate further includes a drive IC 20, a first signal input line 1311, a second signal input line 1312, a first signal output line 1321 and a second signal output line 1322. The first power inputting terminal Vin1 is electrically connected to the drive IC 20 via the first signal input line 1311, the second power inputting terminal Vin2 is electrically connected to the drive IC 20 via the second signal input line 1312, the first induction signal measuring terminal Vout1 is electrically connected to the drive IC 20 via the first signal output line 1321, and the second induction signal measuring terminal Vout2 is electrically connected to the drive IC 20 via the second signal output line 1322.

The control switch 25 includes a control terminal 221, a first electrode 222 and a second electrode 223; and the control terminal 221 is electrically connected to the drive IC 20, to control the turning-on and turning-off of the control switch 25; the first electrode 222 is electrically connected to the first power signal inputting terminal Vin1 of the pressure sensor 13, and the second electrode 223 is electrically connected to the first signal input line 1311; and/or, the first electrode 222 is electrically connected to the second power signal inputting terminal Vin2 of the pressure sensor 13, and the second electrode 223 is electrically connected to the second signal input line 1312. One advantage of the above configuration lies in that the operation state of each of the pressure sensors 13 may be precisely controlled, so that during the touch pressure detection, only a part of the pressure sensors in the display panel are turned on, thereby reducing the power consumption and heat dissipation.

In an embodiment, the control switch 25 may be a thin film transistor. One advantage of using a thin film transistor as the control switch lies in that, the structure is simple, the area for manufacturing the thin film transistor in the non-display region is small, thereby conforming to developing trends of narrow-frame design. In addition, the display panel generally includes a plurality of thin film transistors which are used to control the working states of the pixel units, and thin film transistors which are integrated into the shift registers to generate scanning signals. In an embodiment, the thin film transistors acting as the control switch may be manufactured in the same process with the thin film transistors used to control the working states of the pixel units and thin film transistors which are used to generate scanning signals, thereby reducing the number of the processes, simplifying the manufacturing process and reducing the production cost.

Figure 13:
FIG. 13 is a structural diagram showing a display panel according to an embodiment of the present disclosure.

The present disclosure further provides a display panel. FIG. 13 is a structural diagram for a display panel provided by the embodiments of the present disclosure. Referring to FIG. 13, the display panel 300 includes any one of array substrates 301 provided by the present disclosure. The display panel 300 includes an array substrate 301 and an opposed substrate 302 which is configured to be opposite to the array substrate 301. The display panel 300 may be a liquid crystal display (LCD) panel or an organic light-emitting display (OLED) panel. If the display panel 300 is a LCD panel, the opposed substrate 302 is a color filter. If the display panel 300 is an OLED panel, the opposed substrate 302 is a sealing cover plate.

In the display panel provided the present disclosure, the first resistor, the second resistor, the third resistor and the fourth resistor are disposed at least one of: inside the shift register, between adjacent two of the shift registers, at a side of the shift register close to the display region, and at a side of the shift register away from the display region; and the extension length of the resistor disposed between adjacent two of the shift registers along the first direction is configured to be greater than that along the second direction, and the extension length of the resistor disposed at a side of the shift register close to the display region along the second direction is configured to be greater than that along the first direction, so that it solves the problem that the area of the non-display region of the display panel is increased due to the adjustment of the position of the shift registers and the widened distance between the edge of the shift register close to the display region and the boundary between the display region and the non-display region because of the excessive large size of the pressure sensor of the conventional display panel, thereby decreasing the area of the non-display region of the display panel and conforming to the developing trends of narrow-frame design.

Figure 14:
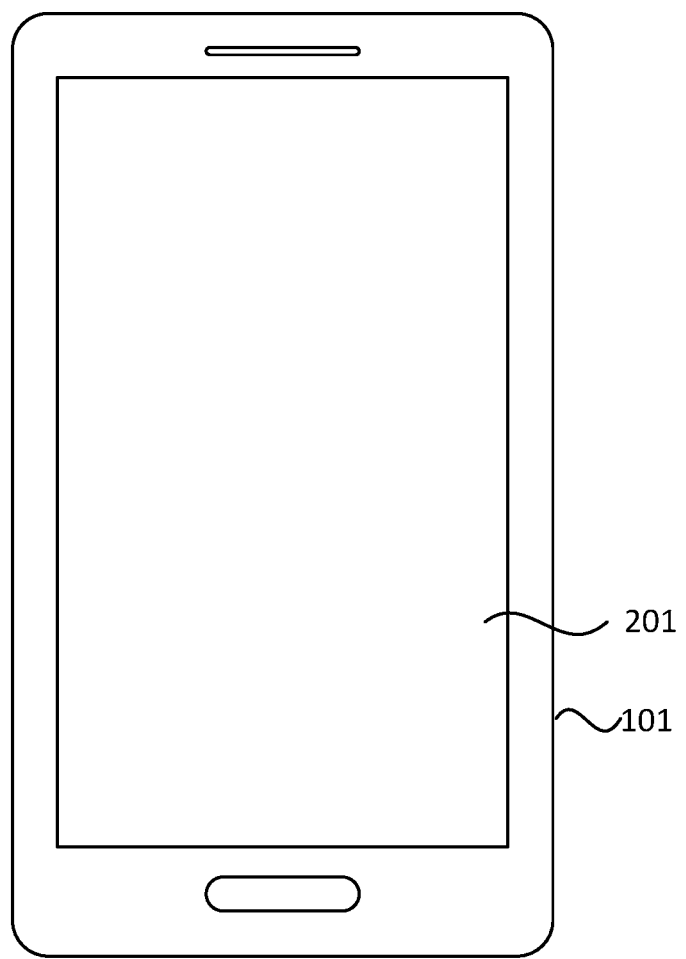
FIG. 14 is a structural diagram showing a display device according to an embodiment of the present disclosure.

The present disclosure further provides a display device. FIG. 14 is a structural diagram showing a display device according to an embodiment of the present disclosure. Referring to FIG. 14, the display device 101 includes any one of the display panels 201 provided by the present disclosure, the display device 101 may be a mobile phone, a tablet computer, a wearable device, etc.

In the display device provided the present disclosure, the first resistor, the second resistor, the third resistor and the fourth resistor are disposed at least one of following positions: inside the shift register, between adjacent two of the plurality of shift registers, at a side of the plurality of shift registers close to the display region, and at a side of the plurality of shift registers away from the display region; and the extension length of the resistor disposed between adjacent two of the shift registers along the first direction is configured to be greater than that along the second direction, when one of the first resistor, the second resistor, the third resistor and the fourth resistor is disposed adjacent two of the shift registers, an extension length of the resistor along the first direction is greater than that along the second direction; when one of the first resistor, the second resistor, the third resistor and the fourth resistor is disposed at a side of the display region close to the plurality of shift registers, an extension length of the resistor along the second direction is greater than that along the first direction, so that it solves the problem that the area of the non-display region of the display panel is increased, due to the adjustment of the position of the shift registers and the widened distance between the edge of the shift register close to the display region and the boundary between the display region and the non-display region because of the excessive large size of the pressure sensor of the conventional display panel, thereby decreasing the area of the non-display region of the display panel and conforming to the developing trends of narrow-frame design.

It can be understood for those skilled in the art that the present disclosure is not limited to the embodiments described herein. For those skilled in the art, the present disclosure can be subject to various apparent variations, readjustments and replacements without departing from a protection scope of the present disclosure. Therefore, although the present disclosure is described in detail through above embodiments, the present disclosure is not only limited to above embodiments. The present disclosure can also include more other equivalent embodiments without deviating from conceptions of the present disclosure. A scope of the present disclosure is determined by a scope of attached claims.

What is claimed is:

1. An array substrate, comprising:
a base substrate, wherein the base substrate comprises a display region, and a non-display region which surrounds the display region, and the base substrate further comprises a first side extending in a first direction and a second side extending in a second direction, and the first direction and the second direction are intersected with each other;
at least one pressure sensor is disposed in the non-display region of the base substrate; wherein the at least one pressure sensor comprises a first resistor, a second resistor, a third resistor and a fourth resistor, and a bridge structure is formed by the first resistor, the second resistor, the third resistor and the fourth resistor; wherein
the non-display region of the base substrate further comprises a plurality of shift registers successively arranged along the second side, a length of each of the plurality of shift registers in the first side is greater than a length of each of the plurality of shift registers in the second side, and the first resistor, the second resistor, the third resistor and the fourth resistor are disposed at least one of following positions: inside the shift register, between adjacent two of the plurality of shift registers, at a side of the plurality of shift registers close to the display region, and at a side of the plurality of shift registers away from the display region; and
when one of the first resistor, the second resistor, the third resistor, and the fourth resistor is disposed between adjacent two of the shift registers, an extension length of the resistor disposed between the adjacent two of the shift registers along the first direction is greater than that along the second direction; and
when one of the first resistor, the second resistor, the third resistor, and the fourth resistor is disposed at a side of the display region closer to the plurality of shift registers, an extension length of the resistor disposed at the side of the display region closer to the plurality of shift registers along the second direction is greater than that along the first direction.

2. The array substrate according to claim 1, wherein
the at least one pressure sensor further comprises a first power inputting terminal, a second power inputting terminal, a first induction signal measuring terminal and a second induction signal measuring terminal;
a first end of the first resistor and a first end of the fourth resistor are electrically connected to the first power signal inputting terminal, a second end of the first resistor and a first end of the second resistor are electrically connected to the first induction signal measuring terminal, a second end of the fourth resistor and a first end of third resistor are electrically connected to the second induction signal measuring terminal, a second end of the second resistor and a second end of the third resistor are electrically connected to the second power signal inputting terminal; and
the first power inputting terminal and the second power inputting terminal are configured to provide a bias voltage signal to the pressure sensor; the first induction signal measuring terminal and the second induction signal measuring terminal are configured to output a pressure detection signal from the pressure sensor.

3. The array substrate according to claim 2, wherein the first direction is orthogonal to the second direction.

4. The array substrate according to claim 3, wherein the material of the first resistor, the second resistor, the third resistor and the fourth resistor is one of amorphous silicon or polysilicon.

5. The array substrate according to claim 4, wherein each of the first resistor, the second resistor, the third resistor and the fourth resistor is one of a P-type resistor and an N-type resistor;
the extension length of each of the first resistor and the third resistor in the first direction is greater than that in the second direction, the extension length of each of the second resistor and the fourth resistor in the second direction is greater than that in the first direction.

6. The array substrate according to claim 5, wherein
M shift registers are disposed at a side of the non-display region of the base substrate, and the M shift registers comprise a N-th stage of shift register, a N+1-th stage of shift register and a N+2-th stage of shift register; wherein
the first resistor is disposed between the N-th stage of shift register and the N+1-th stage of shift register, and the third resistor is disposed between the N+1-th stage of shift register and the N+2-th stage of shift register; wherein
the second resistor is disposed between the N-th stage of shift register and the display region and the fourth resistor is disposed between the N+1-th stage of shift register and the display region; or the second resistor is disposed between the N+1-th stage of shift register and the display region and the fourth resistor is disposed between the N+2-th stage of shift register and the display region; wherein M is a positive integer not less than three, N is a positive integer not less than one and not greater than M−2.

7. The array substrate according to claim 4, wherein each of the first resistor and the third resistor is a P-type resistor; and each of the second resistor and the fourth resistor is an N-type resistor; and
the extension length of each of the first resistor, the second resistor, the third resistor and the fourth resistor in the first direction is greater than that in the second direction; or the extension length of each of the first resistor, the second resistor, the third resistor and the fourth resistor in the second direction is greater than that in the first direction.

8. The array substrate according to claim 4, wherein when the first resistor is an N-type resistor, and each of the second resistor, the third resistor and the fourth resistor are a P-type resistor.

9. The array substrate according to claim 4, wherein when the first resistor is an N-type resistor, and each of the second resistor, the third resistor and the fourth resistor are a P-type resistor.

10. The array substrate according to claim 8, wherein the extension length of each of the first resistor, the second resistor and the fourth resistor in the first direction is greater than that in the second direction, the extension length of the third resistor in the second direction is greater than that in the first direction; or
the extension length of each of the first resistor, the second resistor and the fourth resistor in the second direction is greater than that in the first direction, the extension length of the third resistor in the first direction is greater than that in the second direction; or
the extension length of each of the first resistor, the second resistor, the third resistor and the fourth resistor in the first direction is greater than that in the second direction; or
the extension length of each of the first resistor, the second resistor, the third resistor and the fourth resistor in the second direction is greater than that in the first direction.

11. The array substrate according to claim 1, comprising a plurality of scanning lines, wherein
each of the shift registers is electrically connected to at least one of the scanning lines; and
a projection of the resistor disposed between the shift register and the display region on the base substrate is not overlapped with a projection of the scanning line on the base substrate.

12. The array substrate according to claim 1, wherein the ratio of the resistance of the first resistor to the resistance of the second resistor is equal to that of the resistance of the fourth resistor to the resistance of the third resistor.

13. The array substrate according to claim 12, wherein the resistances of the first resistor, the second resistor, the third resistor and the fourth resistor are equal to each other.

14. The array substrate according to claim 1, further comprising at least one thin film transistor (TFT), wherein the at least one TFT comprises an active layer; wherein the first resistor, the second resistor, the third resistor and the fourth resistor of the pressure sensor are disposed at the same layer with the active layer.

15. The array substrate according to claim 1, wherein the array substrate further comprises a control switch electrically connected to the at least one pressure sensor, and the control switch is configured to control working state of the pressure sensor.

16. A display panel, comprising an array substrate, wherein the array substrate comprises:
a base substrate, wherein the base substrate comprises a display region and a non-display region which surrounds the display region, and the base substrate further comprises a first side extending in a first direction and a second side extending in a second direction, and the first direction and the second direction are intersected with each other;
at least one pressure sensor is disposed in the non-display region of the base substrate; wherein the at least one pressure sensor comprises a first resistor, a second resistor, a third resistor and a fourth resistor, and a bridge structure is formed by the first resistor, the second resistor, the third resistor and the fourth resistor; wherein
the non-display region of the based substrate further comprises a plurality of shift registers successively arranged along the second direction, a length of each of the plurality of shift registers in the first direction is greater than a length of each of the plurality of shift registers in the second direction, and the first resistor, the second resistor, the third resistor and the fourth resistor are disposed at least one of following positions: inside the shift register, between adjacent two of the plurality of shift registers, at a side of the plurality of shift registers close to the display region, and at a side of the plurality of shift registers away from the display region; and
wherein when one of the first resistor, the second resistor, the third resistor, and the fourth resistor is disposed between adjacent two of the shift registers, an extension length of the resistor disposed between the adjacent two of the shift registers along the first direction is greater than that along the second direction; and
wherein when one of the first resistor, the second resistor, the third resistor, and the fourth resistor is disposed at a side of the display region closer to the plurality of shift registers, an extension length of the resistor disposed at the side of the display region closer to the plurality of shift registers along the second direction is greater than that along the first direction.

17. A display device, comprising a display panel, wherein the display panel comprises an array substrate, wherein the array substrate comprises:
a base substrate, wherein the base substrate comprises a display region and a non-display region which surrounds the display region, and the base substrate further comprises a first side extending in a first direction and a second side extending in a second direction, and the first direction and the second direction are intersected with each other;
at least one pressure sensor is disposed in the non-display region of the base substrate; wherein the at least one pressure sensor comprises a first resistor, a second resistor, a third resistor and a fourth resistor, and a bridge structure is formed by the first resistor, the second resistor, the third resistor and the fourth resistor; wherein
the non-display region of the based substrate further comprises a plurality of shift registers successively arranged along the second direction, a length of each of the plurality of shift registers in the first direction is greater than a length of each of the plurality of shift registers in the second direction, and the first resistor, the second resistor, the third resistor and the fourth resistor are disposed at least one of following positions: inside the shift register, between adjacent two of the plurality of shift registers, at a side of the plurality of shift registers close to the display region, and at a side of the plurality of shift registers away from the display region; and wherein when one of the first resistor, the second resistor, the third resistor, and the fourth resistor is disposed between adjacent two of the shift registers, an extension length of the resistor disposed between the adjacent two of the shift registers along the first direction is greater than that along the second direction; and wherein when one of the first resistor, the second resistor, the third resistor, and the fourth resistor is disposed at a side of the display region closer to the plurality of shift registers, an extension length of the resistor disposed at the side of the display region closer to the plurality of shift registers along the second direction is greater than that along the first direction.

\* \* \* \* \*

UNITED STATES PATENT AND TRADEMARK OFFICE
CERTIFICATE OF CORRECTION

PATENT NO. : 10,373,699 B2
APPLICATION NO. : 15/865268
DATED : August 6, 2019
INVENTOR(S) : Zaiwen Zhu et al.

It is certified that error appears in the above-identified patent and that said Letters Patent is hereby corrected as shown below:

On the Title Page

Item (72):
Please correct the address of the first inventor, Zaiwen ZHU, from Shanghai (CN) to Xiamen (CN); and correct the address of the fifth inventor, Qitai JI, from Shanghai (CN) to Xiamen (CN).

Signed and Sealed this
Twenty-fourth Day of September, 2019

Andrei Iancu
*Director of the United States Patent and Trademark Office*